US007472334B1

(12) United States Patent
Scott et al.

(10) Patent No.: US 7,472,334 B1
(45) Date of Patent: Dec. 30, 2008

(54) EFFICIENT METHOD FOR THE RECONSTRUCTION OF DIGITAL INFORMATION

(76) Inventors: Thomas P. Scott, 176 Fairway Dr., Newton, MA (US) 02465; Myron Zimmerman, 65 Farley Pond La., Needham, MA (US) 02492

( * ) Notice: Subject to any disclaimer, the term of this patent is extended or adjusted under 35 U.S.C. 154(b) by 813 days.

(21) Appl. No.: 10/966,984

(22) Filed: Oct. 15, 2004

Related U.S. Application Data

(60) Provisional application No. 60/511,435, filed on Oct. 15, 2003.

(51) Int. Cl.
*H03M 13/00* (2006.01)
(52) U.S. Cl. .................................................. 714/785
(58) Field of Classification Search ............. 714/781, 714/785
See application file for complete search history.

(56) References Cited

U.S. PATENT DOCUMENTS

| 5,485,474 | A | | 1/1996 | Rabin | 371/37.1 |
|---|---|---|---|---|---|
| 6,012,159 | A | * | 1/2000 | Fischer et al. | 714/755 |
| 6,609,223 | B1 | * | 8/2003 | Wolfgang | 714/752 |
| 6,823,425 | B2 | * | 11/2004 | Ghosh et al. | 711/114 |
| 6,986,092 | B2 | * | 1/2006 | Butler et al. | 714/752 |
| 2004/0117718 | A1 | * | 6/2004 | Manasse | 714/781 |

OTHER PUBLICATIONS

A. Bestavros. *SETH: A VLSI chip for the real-time Information Dispersal and retrieval for security and fault tolerance*, Technical Report, TR-06-89, Harvard University (Jan. 1989).
J. Blömer, M. Kalfane, R. Karp, M. Karpinski, M. Luby and D. Zuckerman. *An XOR-based Erasure-Resilient Coding Scheme*. Technical Report, International Computer Science Institute, Berkeley, California, 1995.

* cited by examiner

*Primary Examiner*—M. Mujtaba K Chaudry
*Assistant Examiner*—Sam Rizk
(74) *Attorney, Agent, or Firm*—Burns & Levinson LLP; Jerry Cohen, Esq.; Kathleen Chapman, Esq.

(57) ABSTRACT

Improved method of encoding and repairing data for reliable storage and transmission using erasure codes, which is efficient enough for implementation in software as well as hardware. A systematic linear coding matrix over $GF(2^q)$ is used which combines parity for fast correction of single erasures with the capability of correcting k erasures. Finite field operations involving the coding and repair matrices are redefined to consist of bitwise XOR operations on words of arbitrary length. The elements of the matrix are selected to reduce the number of XOR operations needed and buffers are aligned for optimal processor cache efficiency. Decode latency is reduced by pre-calculating repair matrices, storing them in a hashed table and looking them up using a bit mask identifying the erasures to be repaired.

36 Claims, 15 Drawing Sheets

```
#define    XOR(dst,src)        *(dst) ^= *(src)

/* Multiply the chunk pointed to by pSrc by nF and
 * add to the chunk pointed to by pDst.
 */
void MultiplyAndAdd(long *pDst, int nF, long *pSrc)
{
    switch (nF) {
    case 0:
        break;
    case 1:
        XOR(&pDst[0], &pSrc[0]);
        XOR(&pDst[1], &pSrc[1]);
        XOR(&pDst[2], &pSrc[2]);
        XOR(&pDst[3], &pSrc[3]);
        break;
    case 2:
        XOR(&pDst[0], &pSrc[3]);
        XOR(&pDst[1], &pSrc[0]);
        XOR(&pDst[1], &pSrc[3]);
        XOR(&pDst[2], &pSrc[1]);
        XOR(&pDst[3], &pSrc[2]);
        break;
    case 3:
        XOR(&pDst[0], &pSrc[0]);
        XOR(&pDst[0], &pSrc[3]);
        XOR(&pDst[1], &pSrc[0]);
        XOR(&pDst[1], &pSrc[1]);
        XOR(&pDst[1], &pSrc[3]);
        XOR(&pDst[2], &pSrc[1]);
        XOR(&pDst[2], &pSrc[2]);
        XOR(&pDst[3], &pSrc[2]);
        XOR(&pDst[3], &pSrc[3]);
        break;
    case 4:
        XOR(&pDst[0], &pSrc[2]);
        XOR(&pDst[1], &pSrc[2]);
        XOR(&pDst[1], &pSrc[3]);
        XOR(&pDst[2], &pSrc[0]);
        XOR(&pDst[2], &pSrc[3]);
        XOR(&pDst[3], &pSrc[1]);
        break;
    case 5:
        XOR(&pDst[0], &pSrc[0]);
        XOR(&pDst[0], &pSrc[2]);
        XOR(&pDst[1], &pSrc[1]);
        XOR(&pDst[1], &pSrc[2]);
        XOR(&pDst[1], &pSrc[3]);
        XOR(&pDst[2], &pSrc[0]);
        XOR(&pDst[2], &pSrc[2]);
        XOR(&pDst[2], &pSrc[3]);
        XOR(&pDst[3], &pSrc[1]);
        XOR(&pDst[3], &pSrc[3]);
        break;
```

FIG. 5 (Part 1 of 3)

```
case 6:
    XOR(&pDst[0], &pSrc[2]);
    XOR(&pDst[0], &pSrc[3]);
    XOR(&pDst[1], &pSrc[0]);
    XOR(&pDst[1], &pSrc[2]);
    XOR(&pDst[2], &pSrc[0]);
    XOR(&pDst[2], &pSrc[1]);
    XOR(&pDst[2], &pSrc[3]);
    XOR(&pDst[3], &pSrc[1]);
    XOR(&pDst[3], &pSrc[2]);
    break;
case 7:
    XOR(&pDst[0], &pSrc[0]);
    XOR(&pDst[0], &pSrc[2]);
    XOR(&pDst[0], &pSrc[3]);
    XOR(&pDst[1], &pSrc[0]);
    XOR(&pDst[1], &pSrc[1]);
    XOR(&pDst[1], &pSrc[2]);
    XOR(&pDst[2], &pSrc[0]);
    XOR(&pDst[2], &pSrc[1]);
    XOR(&pDst[2], &pSrc[2]);
    XOR(&pDst[2], &pSrc[3]);
    XOR(&pDst[3], &pSrc[1]);
    XOR(&pDst[3], &pSrc[2]);
    XOR(&pDst[3], &pSrc[3]);
    break;
case 8:
    XOR(&pDst[0], &pSrc[1]);
    XOR(&pDst[1], &pSrc[1]);
    XOR(&pDst[1], &pSrc[2]);
    XOR(&pDst[2], &pSrc[2]);
    XOR(&pDst[2], &pSrc[3]);
    XOR(&pDst[3], &pSrc[0]);
    XOR(&pDst[3], &pSrc[3]);
    break;
case 9:
    XOR(&pDst[0], &pSrc[0]);
    XOR(&pDst[0], &pSrc[1]);
    XOR(&pDst[1], &pSrc[2]);
    XOR(&pDst[2], &pSrc[3]);
    XOR(&pDst[3], &pSrc[0]);
    break;
case 10:
    XOR(&pDst[0], &pSrc[1]);
    XOR(&pDst[0], &pSrc[3]);
    XOR(&pDst[1], &pSrc[0]);
    XOR(&pDst[1], &pSrc[1]);
    XOR(&pDst[1], &pSrc[2]);
    XOR(&pDst[1], &pSrc[3]);
    XOR(&pDst[2], &pSrc[1]);
    XOR(&pDst[2], &pSrc[2]);
    XOR(&pDst[2], &pSrc[3]);
    XOR(&pDst[3], &pSrc[0]);
    XOR(&pDst[3], &pSrc[2]);
    XOR(&pDst[3], &pSrc[3]);
    break;
```

FIG. 5 (Part 2 of 3)

```
case 11:
    XOR(&pDst[0], &pSrc[0]);
    XOR(&pDst[0], &pSrc[1]);
    XOR(&pDst[0], &pSrc[3]);
    XOR(&pDst[1], &pSrc[0]);
    XOR(&pDst[1], &pSrc[2]);
    XOR(&pDst[1], &pSrc[3]);
    XOR(&pDst[2], &pSrc[1]);
    XOR(&pDst[2], &pSrc[3]);
    XOR(&pDst[3], &pSrc[0]);
    XOR(&pDst[3], &pSrc[2]);
    break;
case 12:
    XOR(&pDst[0], &pSrc[1]);
    XOR(&pDst[0], &pSrc[2]);
    XOR(&pDst[1], &pSrc[1]);
    XOR(&pDst[1], &pSrc[3]);
    XOR(&pDst[2], &pSrc[0]);
    XOR(&pDst[2], &pSrc[2]);
    XOR(&pDst[3], &pSrc[0]);
    XOR(&pDst[3], &pSrc[1]);
    XOR(&pDst[3], &pSrc[3]);
    break;
case 13:
    XOR(&pDst[0], &pSrc[0]);
    XOR(&pDst[0], &pSrc[1]);
    XOR(&pDst[0], &pSrc[2]);
    XOR(&pDst[1], &pSrc[3]);
    XOR(&pDst[2], &pSrc[0]);
    XOR(&pDst[3], &pSrc[0]);
    XOR(&pDst[3], &pSrc[1]);
    break;
case 14:
    XOR(&pDst[0], &pSrc[1]);
    XOR(&pDst[0], &pSrc[2]);
    XOR(&pDst[0], &pSrc[3]);
    XOR(&pDst[1], &pSrc[0]);
    XOR(&pDst[1], &pSrc[1]);
    XOR(&pDst[2], &pSrc[0]);
    XOR(&pDst[2], &pSrc[1]);
    XOR(&pDst[2], &pSrc[2]);
    XOR(&pDst[3], &pSrc[0]);
    XOR(&pDst[3], &pSrc[1]);
    XOR(&pDst[3], &pSrc[2]);
    XOR(&pDst[3], &pSrc[3]);
    break;
case 15:
    XOR(&pDst[0], &pSrc[0]);
    XOR(&pDst[0], &pSrc[1]);
    XOR(&pDst[0], &pSrc[2]);
    XOR(&pDst[0], &pSrc[3]);
    XOR(&pDst[1], &pSrc[0]);
    XOR(&pDst[2], &pSrc[0]);
    XOR(&pDst[2], &pSrc[1]);
    XOR(&pDst[3], &pSrc[0]);
    XOR(&pDst[3], &pSrc[1]);
    XOR(&pDst[3], &pSrc[2]);
    break;
    }
}
```

FIG. 5 (Part 3 of 3)

$$\tau(x) = \begin{bmatrix} v(x \cdot 2^0) & v(x \cdot 2^1) & \cdots & v(x \cdot 2^{q-1}) \end{bmatrix}$$

| x | τ(x) | Number of XOR operations |
|---|---|---|
| 0 | $\begin{bmatrix} 0 & 0 & 0 & 0 \\ 0 & 0 & 0 & 0 \\ 0 & 0 & 0 & 0 \\ 0 & 0 & 0 & 0 \end{bmatrix}$ | 0 |
| 1 | $\begin{bmatrix} 1 & 0 & 0 & 0 \\ 0 & 1 & 0 & 0 \\ 0 & 0 & 1 & 0 \\ 0 & 0 & 0 & 1 \end{bmatrix}$ | 4 |
| 2 | $\begin{bmatrix} 0 & 0 & 0 & 1 \\ 1 & 0 & 0 & 1 \\ 0 & 1 & 0 & 0 \\ 0 & 0 & 1 & 0 \end{bmatrix}$ | 5 |
| 3 | $\begin{bmatrix} 1 & 0 & 0 & 1 \\ 1 & 1 & 0 & 1 \\ 0 & 1 & 1 & 0 \\ 0 & 0 & 1 & 1 \end{bmatrix}$ | 9 |
| ... | ... | ... |

FIG. 7B $$A = \begin{bmatrix} I_m \\ P \\ C \end{bmatrix} \quad \text{where} \quad I_m = \begin{bmatrix} 1 & 0 & \cdots & 0 \\ 0 & 1 & \cdots & 0 \\ & & \cdots & \\ 0 & 0 & \cdots & 1 \end{bmatrix}$$

$$P = \begin{bmatrix} 1 & 1 & \cdots & 1 \end{bmatrix}$$

$$C = \begin{bmatrix} c_{1,1} & c_{1,2} & \cdots & c_{1,m} \\ & & \cdots & \\ c_{k-1,1} & c_{k-1,2} & \cdots & c_{k-1,m} \end{bmatrix}$$

FIG. 10

$$\begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 1 & 1 & 1 & 1 \\ 1 & 9 & 13 & 2 & 12 \\ 12 & 2 & 8 & 9 & 1 \end{bmatrix}$$

FIG. 10B $$\begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 1 & 1 & 1 & 1 \\ 9 & 13 & 2 & 4 & 1 \end{bmatrix}$$

FIG. 10C

EFFICIENT METHOD FOR THE RECONSTRUCTION OF DIGITAL INFORMATION

CROSS REFERENCE TO RELATED APPLICATIONS

This application claims the benefit of priority to U.S. Provisional Patent Application Ser. No. 60/511,435, filed Oct. 15, 2003, the contents of which are incorporated herein by reference in their entirety.

FIELD OF THE INVENTION

This invention relates to the reliable storage and/or transmission of digital information and specifically to an improved system and method of encoding and decoding digital information for reliable storage and/or transmission.

BACKGROUND OF THE INVENTION

When digital information is stored or communicated, it may be lost due to the failure of a storage device or loss of a communication packet. Fortunately, various linear erasure correcting codes are available to recover lost information despite storage failures and packet losses. Examples include the common Reed-Solomon code and the Information Dispersal Algorithm (IDA) of Rabin (U.S. Pat. No. 5,485,474).

Linear erasure correcting codes provide a number of advantages over data replication and parity schemes. Unlike replication, these codes are storage optimal. And unlike parity schemes which can protect digital information from a single failure or loss, linear erasure correcting codes can protect data from an arbitrary number of losses.

Linear erasure correcting codes work by breaking the data to be stored or communicated into m segments, using a linear transformation to produce n=m+k encoded pieces and independently storing or communicating the encoded pieces (i.e. dispersing the information). The segments and encoded pieces are of equal size. The linear transformation has the special property that the original m segments can be recreated by decoding any m of the n encoded pieces that have survived a failure or loss. This provides systems using the codes with resilience to k failures or losses.

The linear transformation operates on chunks. The segments are broken into equal sized chunks, the chunks are assembled into m×l vectors and the vectors are transformed by multiplication with an n×m encoding matrix A defined over a finite Galois Field $GF(2^q)$. The result of the matrix multiplications is a sequence of n×l vectors consisting of transformed chunks that are reverse assembled into the pieces.

The matrix A has special properties that are well understood in coding theory. Reed-Solomon codes have traditionally used a Vandermonde matrix for the matrix A, but subsequent work has identified other matrices that have the necessary properties. Rabin provides an example of such a matrix:

$$A = (a_{i,j})$$

$$a_{i,j} = \frac{1}{x_i + y_j}$$

where $$x_i + y_j \neq 0 \text{ for all i,j}$$

$$x_i \neq x_j \text{ and } y_i \neq y_j \text{ for } i \neq j$$

This matrix is known as a Cauchy matrix. A Cauchy matrix has the important property that each square sub-matrix created from it is invertible. This is an important property since losing encoded pieces is mathematically equivalent to deleting rows from matrix A and segment recovery depends upon the invertability of the resulting row deprecated matrix.

Another important property of Cauchy matrices is that they can be inverted in $O(n^2)$ operations instead of the $O(n^3)$ operations required to invert general matrices. This property of Cauchy matrices is important for applications that must perform the matrix inversion as part of the recovery process. But for many applications, the number of possible inverse matrices is small and can be pre-calculated, stored and quickly looked up when a particular recovery scenario arises. When inverse matrices are pre-calculated, the $O(n^2)$ advantage of Cauchy matrices is diminished.

A Cauchy matrix does not result in particularly efficient encoding and decoding, however, for a couple of reasons. First, it does not result in what is called a systematic encoder in Coding Theory. Systematic encoders have the property that the first m of n encoded pieces produced by the encoder, called data pieces, are identical to the first m segments. The pieces that bear no resemblance to the segments are called ECC pieces. Systematic encoders create n-m ECC pieces. Using a Cauchy matrix, a non-systematic code, all n encoded pieces are ECC pieces and the decode operation is required as part of every data retrieval. A systematic encoder is more efficient in that fewer matrix multiplications are needed to encode and decoding is not required unless pieces have been lost.

Secondly, the Cauchy matrix approach is not as efficient as parity techniques when recovering from single failures. Parity techniques only require the XOR of all the surviving pieces in order to recover a missing segment. IDA using a Cauchy matrix requires the more complex calculations of a linear transformation consisting of multiplication and XOR operations over $GF(2^q)$. This difference in performance for single failure recovery is important because even in systems designed to withstand multiple failures, the single failure case is expected to dominate.

Improving the computational performance of linear transformations like that used for erasure correcting codes has been a topic of research. At the time that IDA was first disclosed, special hardware was considered the most promising way to improve performance. Bestavros [A. Bestavros, *SETH: A VLSI chip for the real-time Information Dispersal and retrieval for security and fault tolerance*, Technical Report, TR-06-89, Harvard University, (January, 1989.)] discusses the design of a VLSI chip to offload IDA data manipulations. By the mid-1990s, however, the performance of general purpose processors had progressed enough that software implementations of linear codes became practical. Blömer et al [J. Blömer, M. Kalfane, R. Karp, M. Karpinski, M. Luby and D. Zuckerman. *An XOR-based Erasure-Resilient Coding Scheme*. Technical Report, International Computer Science Institute, Berkeley, Calif., 1995] describe such a software implementation prototyped on a Sun SPARCstation 20 workstation.

Blömer was able to achieve considerable performance gains through two improvements. The first improvement was to use a Cauchy derived matrix that was systematic. The second improvement was to map matrix operations over $GF(2^q)$ to equivalent operations over $GF(2)$. In the $GF(2)$ representation of the coding matrix, the arithmetic operations are AND and XOR on single bits rather than multiply and XOR on q-bit quantities. While operations on single bits may seem to be less efficient than operations on q-bit quantities (where q is typically limited to either 8 or 16), processors with 32-bit words can perform the operations in parallel, 32 bits at a time. Thus Blömer makes the connection between linear transformations over $GF(2^q)$ with XOR operations that can be efficiently implemented by general purpose processors.

While Blömer teaches how to create a systematic code, the code is still not as efficient as parity for the single failure case and is therefore not a practical replacement for parity techniques. In addition, the prototype implementation does not exploit nor teach optimizations that are in the present invention.

SUMMARY OF THE INVENTION

In one aspect, the present invention provides a high performance linear erasure correcting code and method for protecting digital information from data loss (e.g., during storage and retrieval or transmission) that is efficient enough to be implemented in software as well as in hardware. High encode and decode performance is achieved in part by mapping multiplication operations in $GF(2^q)$ to XOR operations on arbitrary length words of bits.

In another aspect, the present invention provides a computer system implementation of the high performance linear erasure correcting method. The computer system includes a processor executing the erasure correcting code retrieved from storage, memory, or from a computer readable storage medium. Many processors have special instructions that can manipulate word multiples, and abstracting the word length allows these instructions to be used. In addition, the computer system may have custom hardware that can perform XOR on very long words.

The choice of q affects performance in a number of ways and the invention makes an optimal choice of this value. From coding theory, the minimum distance of the code must be 2k+1 in order to recover k lost pieces. For a given coding matrix and choice of m and k, this often implies that q must exceed a lower bound. The present invention satisfies this constraint but uses a value of q which results in buffers that are properly aligned for best processor performance and which reduces the number of XOR operations needed to perform the multiplications.

A pre-calculated table of functions may be used for implementing the multiplications that are indicated by the coding matrix. Each function comprises a particular sequence of XOR instructions that implements a multiplication by a value in $GF(2^q)$. The table is indexed by elements of the coding matrix over $GF(2^q)$. This use of straight line code reduces the control overhead from that used in prior art, which requires iterative testing of the elements of the coding matrix in its $GF(2)$ representation to determine if a particular XOR is to be performed. For $GF(2^4)$ there are 16 times fewer control choices that the processor needs to make by using the table of functions.

Processor cache utilization is an important consideration for high performance. Each function in the table of functions operates on q adjacent hyperwords that start on a cache line boundary. Each hyperword is a multiple of the processor's word size and q hyperwords are a multiple of the cache line size. Consequentially, cache misses do not pull in data unrelated to the encoding and/or decoding method and there is no false sharing of cache lines.

Many computer processors have special instructions to speed up bit operations. In one embodiment of the invention, MMX and SSE2 instructions are used on Pentium III™ and Pentium 4™ microprocessors, respectively. MMX instructions increase the number of bits operated on in parallel to 64. SSE2 instructions increase the number of bits operated on in parallel to 128.

The encoding matrix is systematic and reduces to parity for recovery of single failures. In addition, the first Erasure Correcting Code (ECC) block is parity, increasing the performance of encoding.

The invention exploits the fact that the number of XOR operations needed to perform a multiplication varies with the multiplication factor itself. The values in $GF(2^q)$ are sorted by the number of XOR operations needed for their implementation. Using this table as a guideline, the encoding matrix is selected (within constraints) to reduce the computation for encoding. Encoding performance is important since it is performed on every write while decoding only needs to be performed when there has been an erasure and/or data loss.

Linear erasure correcting codes typically require a matrix inversion in order to derive the decode matrix for retrieving the data from a particular set of pieces. Many applications cannot tolerate the latency introduced by this calculation. For such applications the invention makes use of a bit mask that represents a particular combination of failures and uses this bit mask to perform a hashed lookup of pre-calculated inverse matrices.

BRIEF DESCRIPTION OF THE DRAWING

The invention is described with reference to the several figures of the drawing, in which.

FIG. 5 is a listing of an exemplary MultiplyAndAdd(d, f, s) subroutine in the C programming language for q=4 and $N_W=1$;

FIG. 7B is a table showing a matrix τ(x) for some values in $GF(2^4)$;

FIG. 10 is a diagram of an embodiment of the (k+m)×m coding matrix A in accordance with the present invention;

FIG. 10B is a diagram of an optimal 8×5 coding matrix with coefficients chosen from $GF(2^4)$;

FIG. 10C is a diagram of an optimal 7×5 coding matrix with coefficients chosen from $GF(2^4)$;

DETAILED DESCRIPTION OF THE INVENTION

Figure 1:
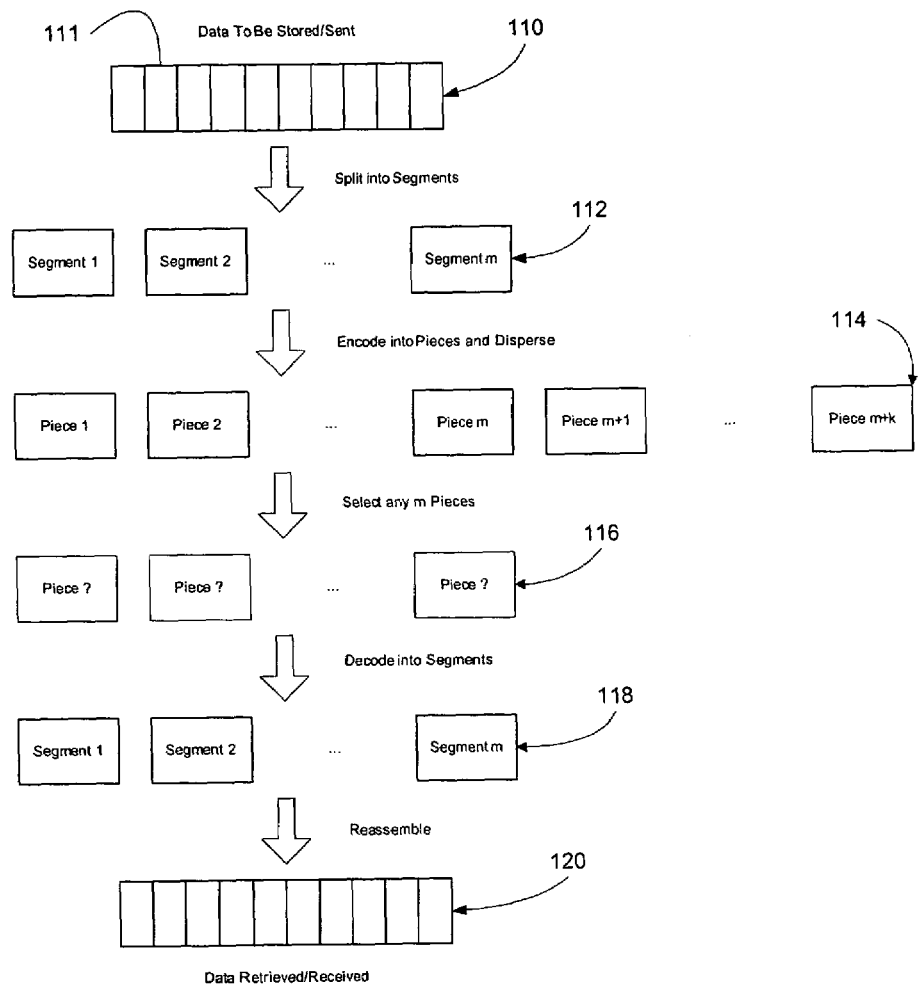
FIG. 1 is a block diagram showing a method being used to encode and decode data.

FIG. 1 illustrates the treatment of digital data 110 in a process of using a linear erasure code to protect the data from loss and to recover the data once loss has taken place. The data 110 to be stored or communicated is comprised of N chunks 111 and is broken into m segments 112. Each of the segments is of equal length and contains N/m chunks. The data 110 may be padded so that it is evenly divisible by m. Each chunk 111 (referred to as an "element" by Rabin) is comprised of a fixed number of bits that are manipulated as a value in a computational field.

Through use of a coding matrix as described below, the m segments are encoded into m+k pieces 114, where k is the maximum number of erasures that the system is designed to correct. Each piece 114 contains N/m chunks. If the coding matrix is systematic, the first m pieces 114 are identical to the m segments 112. The m+k pieces are dispersed by storing them on m+k separate storage devices (not shown) or by transmitting them in m+k separate packets. A number from 1 to m+k identifies each piece 112 and is stored with or sent along with the pieces so that the identity of recovered pieces can be determined. The encoding has the property that only m of the m+k pieces are needed to recover the m segments.

To read the data, m selected pieces 116 of the m+k pieces are selected and decoded into m segments 118. The identity of the m selected pieces 116 allows a proper decoding process to be applied. When there are fewer than k failures, the choice of the m selected pieces 116 is based on which are easiest to decode. The segments are then reassembled into original data 120 that is identical to the digital data 110.

The encoding process involves multiplying vectors created from the chunks 111 contained in the segments 112 by a (m+k)×m coding matrix A. The vectors are assembled from the chunks 111. Each segment is associated with a component of an m×1 vector. A chunk is taken from each of the m segments to assemble the m×1 vector. The process of taking a chunk 111 from each segment 112 and assembling a vector is repeated until a sequence of N/m such vectors is assembled. The j-th component of vector $x_i$ in the sequence is constructed from the i-th chunk of the j-th segment. To encode the segments into pieces, each assembled vector $x_i$ in the sequence is linearly transformed into an n×1 vector $y_i$ using operations in the finite field. In matrix notation, the transformation is:

$$y_i = A x_i \text{ for all } i = [1, N/m]$$

where n×m matrix A is the encoding matrix. The components of the sequence of vectors $y_i$ for i=[1,N/m] are reverse-assembled into n pieces. The reverse-assembly is the inverse of the assembly. That is, the assembly of chunks within pieces into vector $y_i$ is identical to the assembly of chunks within segments into vectors $x_i$. Each piece is associated with a specific component of vectors $y_i$ in the sequence. The j-th component of vector $y_i$ in the sequence comprises the i-th chunk of piece j.

To read the data, only m of the m+k pieces are needed. Lost pieces correspond mathematically to matrix row deletions on both sides of the above equation. For a particular combination of k lost pieces identified by the set F of k row indices, a row deletion operator $D_F(z)$ may be defined to delete the particular set of k rows from the matrix or vector z. The equation describing the k lost pieces then satisfies:

$$D_F(y_i) = D_F(A) \cdot x_i \text{ for all } i = [1, N/m]$$

A valid coding matrix A has the property that the matrix $D_F(A)$ is non-singular for all choices of k row deletions. The inverse matrix, $[D_F(A)]^{-1}$, is then the decoding matrix and the decoding operation is $$[D_F(A)]^{-1} \cdot D_F(y_i) = x_i \text{ for all } i = [1, N/m]$$

As an obvious optimization, if a systematic coding has been used then decoding is unnecessary unless one or more of the first m pieces has been lost.

The matrix multiplication of $[D_F(A)]^{-1}$ and $D_F(y_i)$ is a standard matrix multiplication with row and column indices taking values of 0 to m−1 (or alternatively from 1 to m). The row deletion operator implies a remapping, however, of the row index of its argument that is illustrated by example. If the set F contains only a single row index, which is the row index j, then the i-th row of $D_F(z)$ is the i-th row of z for i<j but is the (i+1)-th row of z for i≧j. In the general case where the set F contains k row indices, the mapping of the m rows of $D_F(z)$ to the m+k rows of z is a m×1 vector PM that is created by:

STEP 1. Set i and j to the lowest row index number of vector z.

STEP 2. If j∉F, then assign $PM_i = j$ and increment i.

STEP 3. Increment j.

STEP 4. Repeat steps 2 and 3 until all the rows of vector PM have been assigned values.

The definition of the chunk is closely related to performance. Rabin defines the chunk as a q-bit byte and the coding matrix and all arithmetic operations are over $GF(2^q)$. But multiplication over $GF(2^q)$ becomes prohibitively expensive for q>16. This is because multiplication over finite fields is usually implemented by log and anti-log table lookup and these tables must fit within the processor cache for good performance.

By using a transformation, Blömer is able to define the size of the chunk as 32 bits and avoid the necessity of using multiplication in the encoding and decoding loops. Blömer's method first starts off with a (m+k)×m coding matrix in $GF(2^q)$ and transforms the matrix into a (m+k)·q×m·q matrix over GF(2). This transformed matrix is used to manipulate bits, 32 at a time that are packed in 32-bit words. In Blömer's transformed representation, the matrix elements are 0 and 1 and indicate whether specific combinations of 32-bit words are to be XORed together.

As a consequence of the finite number of elements in a finite field, q must be chosen large enough so that the coding matrix can be inverted for all possible deletions of k rows. This minimum value depends on the choice of coding matrix—so the condition on q is $q \geq q_{min}(A)$ Increasing q above $q_{min}(A)$ has an affect on two design parameters of the present invention. First, the number of elements in the finite field increases, which increases the number of processor instructions and/or ancillary tables necessary to multiply two field elements together. Second, the number of XOR operations needed to encode each hyperword generally increases. The first effect is not a significant factor and values of q as large as approximately 8 can be easily accommodated. The second effect is mitigated in one embodiment of the present invention by optimizing the choice of the coefficients in the encoding matrix. Using an optimized encoding matrix, the number of XOR operations per hyperword can be kept nearly constant as q increases.

Figure 2A:
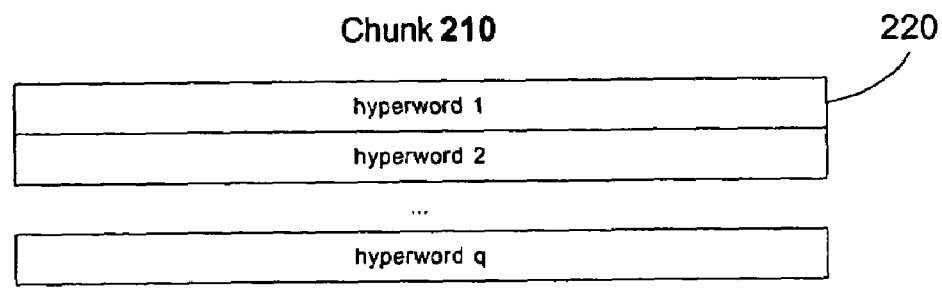
FIG. 2A is a block diagram showing the composition of a data chunk in accordance with one embodiment of the present invention.
Figure 2B:
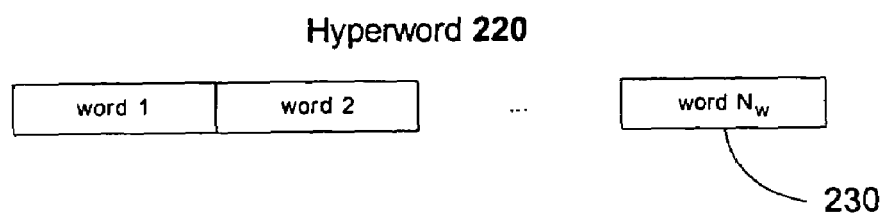
FIG. 2B is a block diagram showing the composition of a hyperword in accordance with one embodiment of the present invention.
Figure 2C:
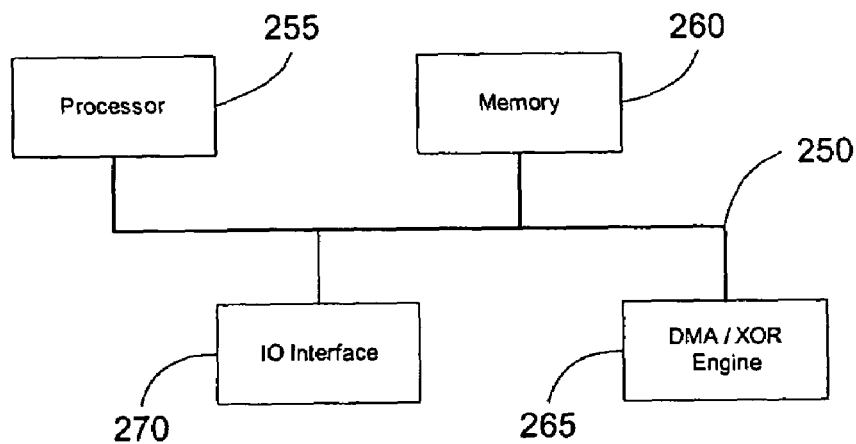
FIG. 2C is a block diagram showing a computerized system in accordance with one embodiment of the present invention.

FIG. 2C illustrates the hardware components in one embodiment of the present invention. A processor 255, memory 260 and I/O interface 270 interact through an interconnect 250 through which data and control can pass. A DMA/XOR engine 265 may also be present. The processor may be a general purpose processor that is part of a computer system, or may be a special purpose processor dedicated to storage or communication. The memory may consist of ROM as well as RAM. In one embodiment of the invention, a pre-calculated table of functions is stored in ROM. The I/O interface connects the system to the digital information that is to be protected by erasure correcting codes. In a storage application, the I/O interface would typically provide access to a disk array. In a communication application, the I/O interface would typically provide access to data packets on a network.

In one embodiment of the invention, data movement and XOR operations on hyperwords are performed by the DMA/XOR Engine, which is programmed by the processor. In an alternative embodiment of the invention, data movement and XOR operations on hyperwords is performed directly by the processor. This would typically be the case where the processor is a general purpose processor with substantial amount of cache and fast access to memory. To maximize performance of such architecture, the cache must be effectively managed.

The current invention defines the size of the data chunk to effectively utilize a processor cache and to make use of any special purpose XOR instructions that may be supported. Referring to FIG. 2A and FIG. 2B, each chunk 210 consists of q contiguous hyperwords 220, while each hyperword consists of $N_W$ contiguous words 230. Memory used for storing segments and pieces is cache aligned so that all chunks are cache aligned. The choice of q and $N_W$ affect performance and are chosen as follows:

The value of q is chosen to satisfy $q \geq q_{min}(A)$;

For those processors that have special instructions for performing XOR on values larger than a word, $N_W$ is chosen to be an integral multiple of this size to allow the use of such instructions on the hyperwords; and The values of q and $N_W$ are chosen such that the chunk size, which equals $q \cdot N_W$, is a multiple of a cache line size.

In one embodiment of the invention, the encoding matrix A is optimized so that performance is relatively insensitive to variation in q and minimization of q is subsidiary to the criteria enumerated above. In an alternative embodiment of the invention, the encoding matrix A is not optimized, q is a factor in performance and consequentially q is chosen to be the smallest value that satisfies the above criteria.

It is important that the size of a chunk is a multiple of a cache line size so that the cache utilization is not reduced by data not associated with the computation. The values of q and $N_W$ will typically be powers of 2 but not necessarily so as illustrated in the following example. On a Pentium III™ processor, for example, the word size is 32 bits, cache line size is 8 words, and a special MMX XOR instruction is supported that operates on 64-bits (2 words). A q of 6 can be accommodated by using $N_W=4$, resulting in a chunk size that is 3 cache lines.

In one embodiment of the invention, the form of the matrix A is given in FIG. 10 and consequently $q_{min}$ is the smallest integer greater than or equal to $\log_2(m+k-1)$. This leads to a particularly simple choice of q that is dependent only on the maximum value of m+k that is to be encountered in practice. Values of $q_{min}$ for various maximum values of m+k are given in Table 1.

TABLE 1

| Maximum m + k | $q_{min}$ |
|---|---|
| 5 | 2 |
| 9 | 3 |
| 17 | 4 |
| 33 | 5 |
| 65 | 6 |
| 129 | 7 |
| 257 | 8 |

For storage systems, selecting q=4 is a particularly attractive choice. With this value of q, values of m+k up to 17 are supported are supported by the invention, which is a sufficiently broad range to cover most uses of the invention as a RAID replacement. Being a small power of two, this value of q also allows great flexibility in the choice of chunk size.

For communications systems, larger values of q (e.g. 6 or 8) can be more attractive choices. In such systems the chunk size is typically limited to the payload of a physical packet and higher values of m+k are used to spread the cost of forward error correction over a larger number of bytes transmitted.

Figure 3:
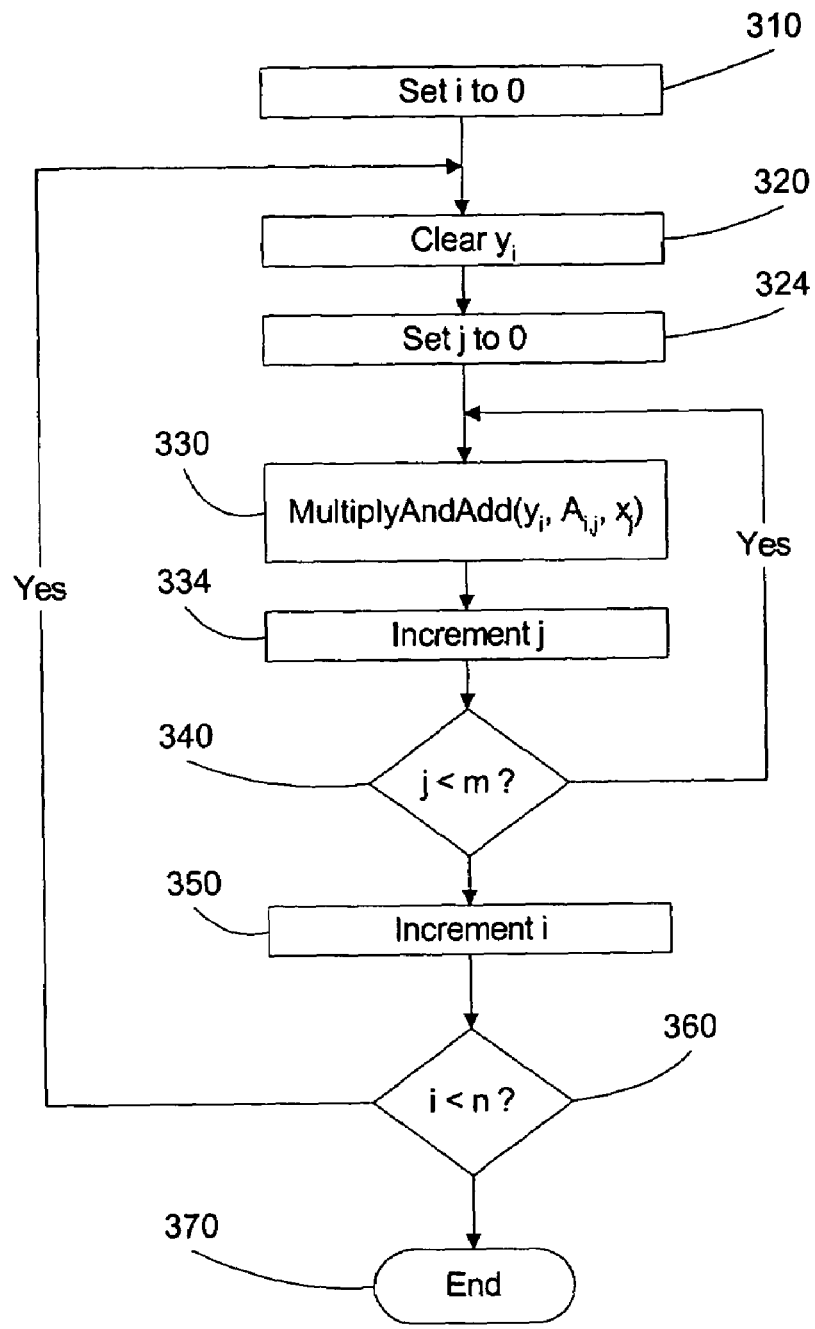
FIG. 3 is a flowchart of the process of matrix multiplication using an implementation of the MultiplyAndAdd(d, f, s) subroutine in accordance with one embodiment of the present invention.

The present invention avoids the need to transform the coding matrix by extending the definitions of addition and multiplication to apply to chunks. A subroutine MultiplyAndAdd(d, f, s) is defined to multiply chunk s by $f \in GF(2^q)$ and add the result to chunk d. FIG. 3 shows subroutine MultiplyAndAdd (d, f, s) being used to multiply m×1 vector x by n×m matrix A over $GF(2^q)$ to produce n×1 vector y. The components of vectors x and y, denoted by $x_i$ and $y_i$, are chunks. Variables i and j index vector components and array elements and start at 0. The algorithm consists of an inner loop and an outer loop. Before the outer loop, variable i is set to zero (step 310). In steps 350 and 360 at the bottom of the outer loop, variable i is incremented and compared with the number of rows n. The outer loop terminates (step 370) when i has iterated through all the rows. For each value of i, $y_i$ is cleared (step 320), which involves setting the bits of the chunk to zero. In step 324 before the inner loop, variable j is set to zero. Each iteration through the inner loop calls, in step 330, the MultiplyAndAdd subroutine. In steps 334 and 340 at the bottom of the inner loop, variable j is incremented and compared with the number of columns m. The inner loop terminates when j has iterated through all the columns.

The algorithm in FIG. 3 will be recognized by one skilled in the art as one of many variations that implement matrix multiplication. Indeed, many variations of this algorithm are possible. Subroutine MultiplyAndAdd (d, f, s) is defined, however, so that the vectors can have chunks, as described in FIG. 2A and FIG. 2B, as components.

Figure 4:
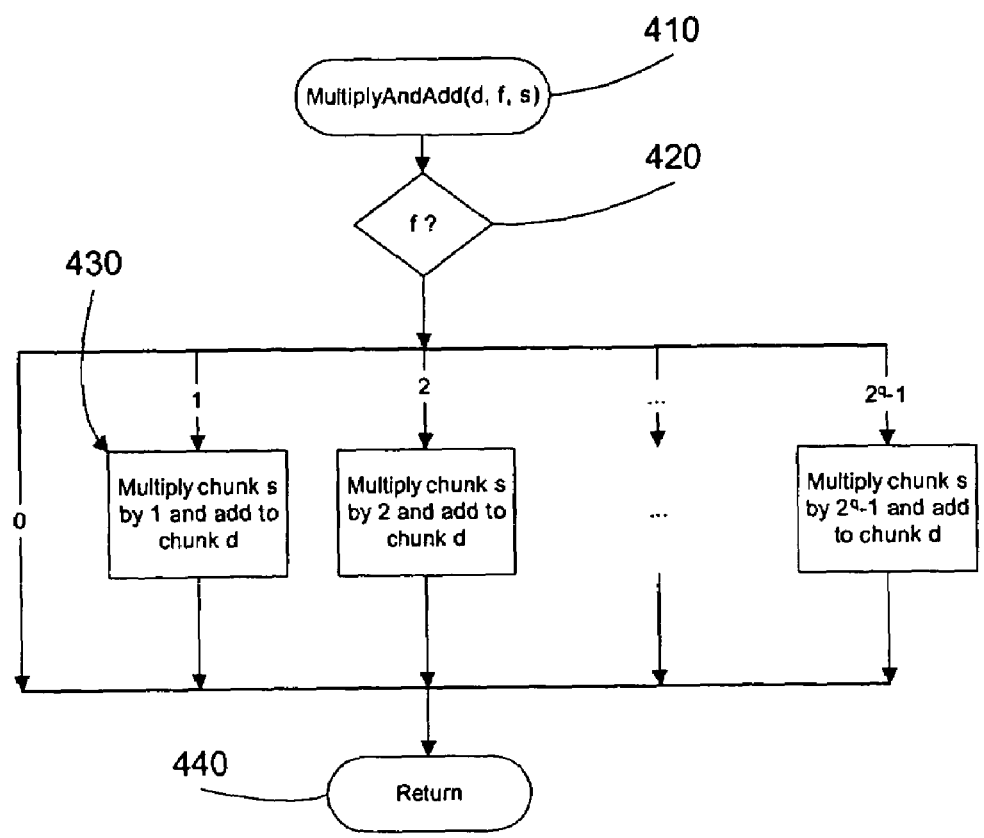
FIG. 4 is a flowchart of an embodiment of the MultiplyAndAdd(d, f, s) subroutine.

In another embodiment of the invention, the MultiplyAndAdd subroutine is implemented by a case statement dependent on f or equivalently by dispatching execution through a jump table indexed by f. This structure is illustrated in the flowchart in FIG. 4. In step 410, the subroutine is called with arguments d and s, which refer to chunks, and argument f∈GF($2^q$). The multiplication factor f is tested in step 420 and execution is switched to the appropriate code. There are $2^q$ possible execution paths 430, one for each value in GF($2^q$). Each execution path is responsible for multiplying chunk s by a specific constant in GF(2) and adding the product to chunk d. All the code paths then return from the subroutine in step 440. For the special case where f=0, the MultiplyAndAdd subroutine performs no operation.

There are advantages in keeping the coding matrix in GF($2^q$) rather than transforming it into a larger matrix in GF(2) as is done in the prior art. In the GF($2^q$) representation, for example, the matrix can be stored compactly. Compactness is important because the inverse matrices are pre-calculated, stored in memory and are looked up rather than computed on the fly. Compact data structures are more likely to be cached in the processors cached.

The invention also has the advantage of fewer conditional branches in processor execution. Processors make most efficient use of their pipelines when processing unbranched code and there are performance penalties associated with conditional branching. A transformed matrix requires a conditional branch for each bit in the matrix. So the prior art uses $q^2$ times more conditional branches than the current invention using a MultiplyAndAdd subroutine that has a single conditional branch.

FIG. 5 shows a non-limiting example of the MultiplyAndAdd subroutine in the C programming language for q=4 and $N_W$=1. Pointers to the chunks are passed as arguments to the subroutine. The body of code implementing each case comprises a sequence of statements that each XOR a hyperword from the source chunk into a hyperword of the destination chunk. The XOR operation is done with the aid of a macro that expands to C statements that performs the actual bitwise exclusive-or of the memory locations passed as arguments.

Each of the cases in the MultiplyAndAdd subroutine implements multiplication and addition of chunks through a transformation of the operators in GF($2^q$). For each multiplicative factor f in GF($2^q$), there is a q×q matrix τ(x) in GF(2) which can be used to multiply values in GF($2^q$) that are represented as q×1 vectors of bits. The operation of the MultiplyAndAdd(d,f,s) subroutine is given as $$d=d+\tau(f)\cdot s$$

where the algebraic operations are over GF(2). Over GF(2) addition is XOR and multiplication is AND. In applying the above, each chunk is treated as a q×1 vector of hyperwords and XOR operations when applied to the components of d and s are applied to all the bits of the hyperword rather than to individual bits.

Figures 6, 7A:
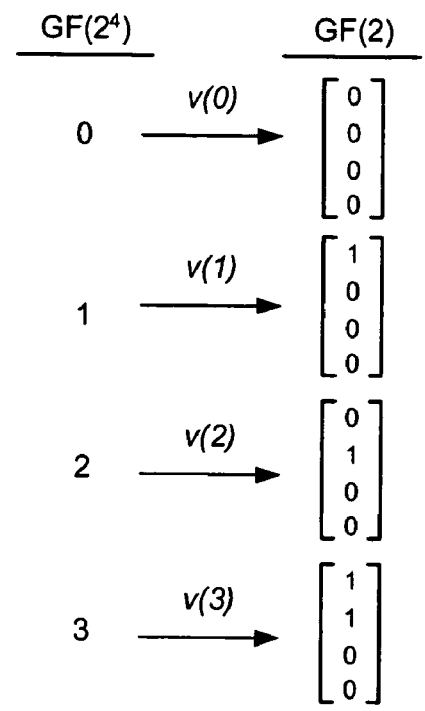
FIG. 6 is a diagram depicting the construction of a q×q matrix τ(x) over $GF(2)$ in accordance with one embodiment of the present invention.
FIG. 7A is a table showing the mapping of some values in $GF(2^4)$ to bit vectors in $GF(2)$.

FIG. 6 illustrates the construction of the q×q matrix τ(x). For j=0 through q−1, column j of the matrix is the bit vector representation of the expression x·$2^j$ evaluated using arithmetic over GF($2^q$). The function v(z) maps a value z in GF($2^q$) to a q×1 bit vector with components in GF(2). Let $v_j(z)$ be the j-th component of the vector. Then the components of the q×1 bit vector are related to z by $$z = \sum_{j=0}^{q-1} v_j(z) \cdot 2^j$$

where the arithmetic is over the field of integers. One skilled in the art will recognize v(z) to be the binary representation of z where the bit positions are mapped to components of the vector.

FIG. 7A provides examples of some values in GF($2^4$) and their 4×1 bit vector equivalents. And FIG. 7B provides some examples of τ(x) constructed for GF($2^4$). An XOR is required between hyperwords whenever $\tau_{i,j}(x)$=1. The count of the number of non-zero elements in τ(x) is the number of XOR operations that needs to be performed on hyperwords to implement multiplication by the factor x.

Figure 8:
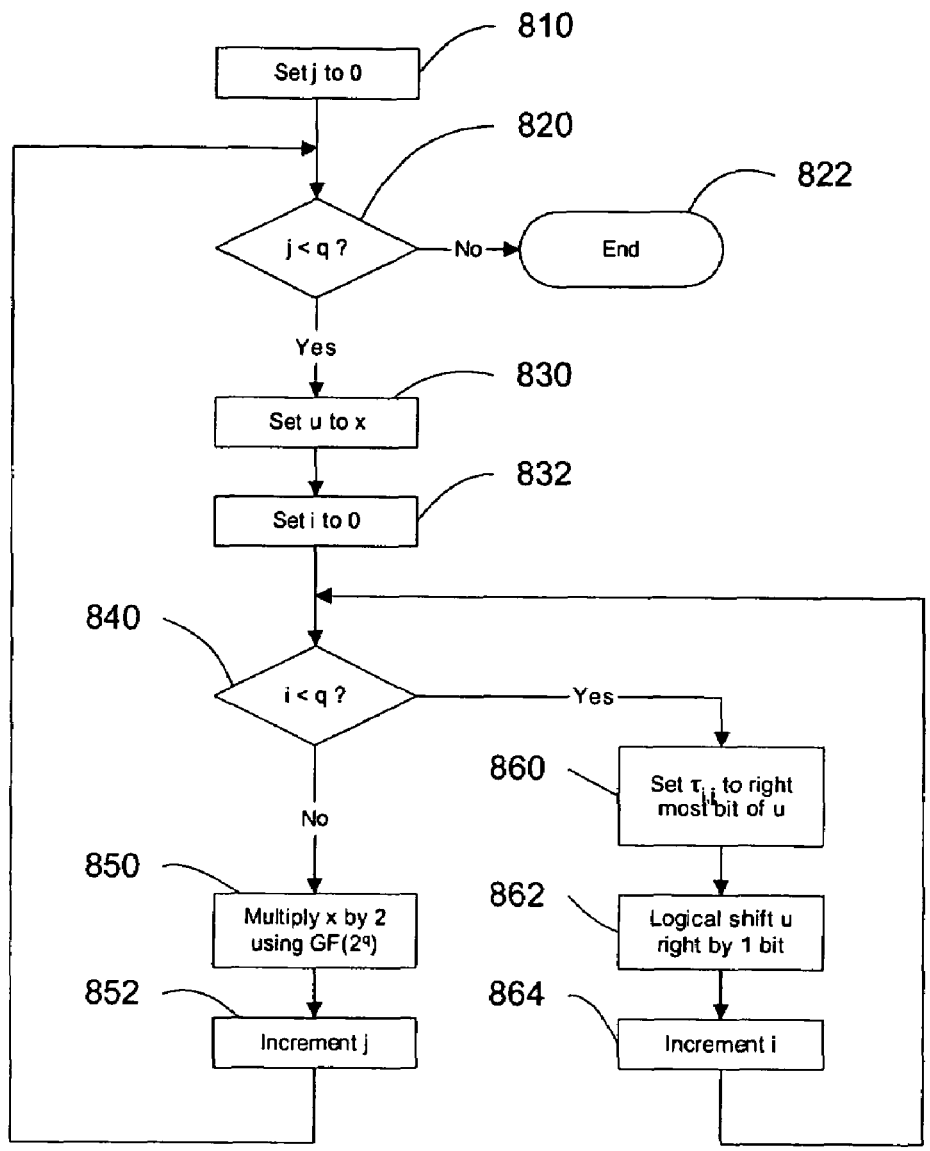
FIG. 8 is a flowchart for constructing a matrix τ(x) in accordance with one embodiment of the present invention.

FIG. 8 shows one embodiment of an algorithm for constructing a q×q matrix τ over GF(2) that is associated with multiplication by x over GF($2^q$). The process consists of an outer and an inner loop. Variables i and j index the rows and columns, respectively, of matrix τ. The outer loop iterates the columns. The variable j is initialized to zero in step 810. The outer loop begins at step 820 by comparing j with q to determine if any more columns remain. If all the columns have been iterated over, the outer loop and the flowchart end (step 822) with matrix τ set to correspond to the initial value of x. Upon the end of the flowchart, the parameter x will have been modified by the algorithm and will no longer have its initial value. The variable u is used to test the bit positions of the binary representation of x. Before entering the inner loop, u is initialized to the current value of x (step 830) and i is initialized to zero (step 832). The inner loop begins at step 840 by comparing i with q to determine if any more rows remain. If there are, matrix element $\tau_{i,j}$ is set to the rightmost bit of u (step 860), u is logically shifted right by 1-bit (step 862), i is incremented (step 864) and the inner loop is repeated. After the inner loop terminates, the value of x is multiplied by 2 using arithmetic over GF($2^q$) (step 850). This operation is typically implemented using log and anti-log tables and would be apparent to someone skilled in the art of finite fields. Finally, in step 852 the index j is incremented and the outer loop is repeated.

It should be noted that each of the tasks or processes described herein may be implemented in computer programs and/or hardware, including creating the sequence of statements implementing each case. Computer programs accomplishing all or parts of the methods described comprise ordered listings (source code) of executable instructions for implementing logical functions, and can be embodied in any computer-readable medium for use or transport. In the context of this document, a "computer-readable medium" can be any means that can contain or store, the program for use by or in connection with the instruction execution system, apparatus, or device. The computer readable medium can be, for example but not limited to, a semiconductor system, apparatus, or device, including portable computer diskettes, random access memory (RAM), read-only memory (ROM), erasable programmable read-only memory (EPROM or Flash memory), and portable compact disc readonly memory (CDROM).

Figure 9:
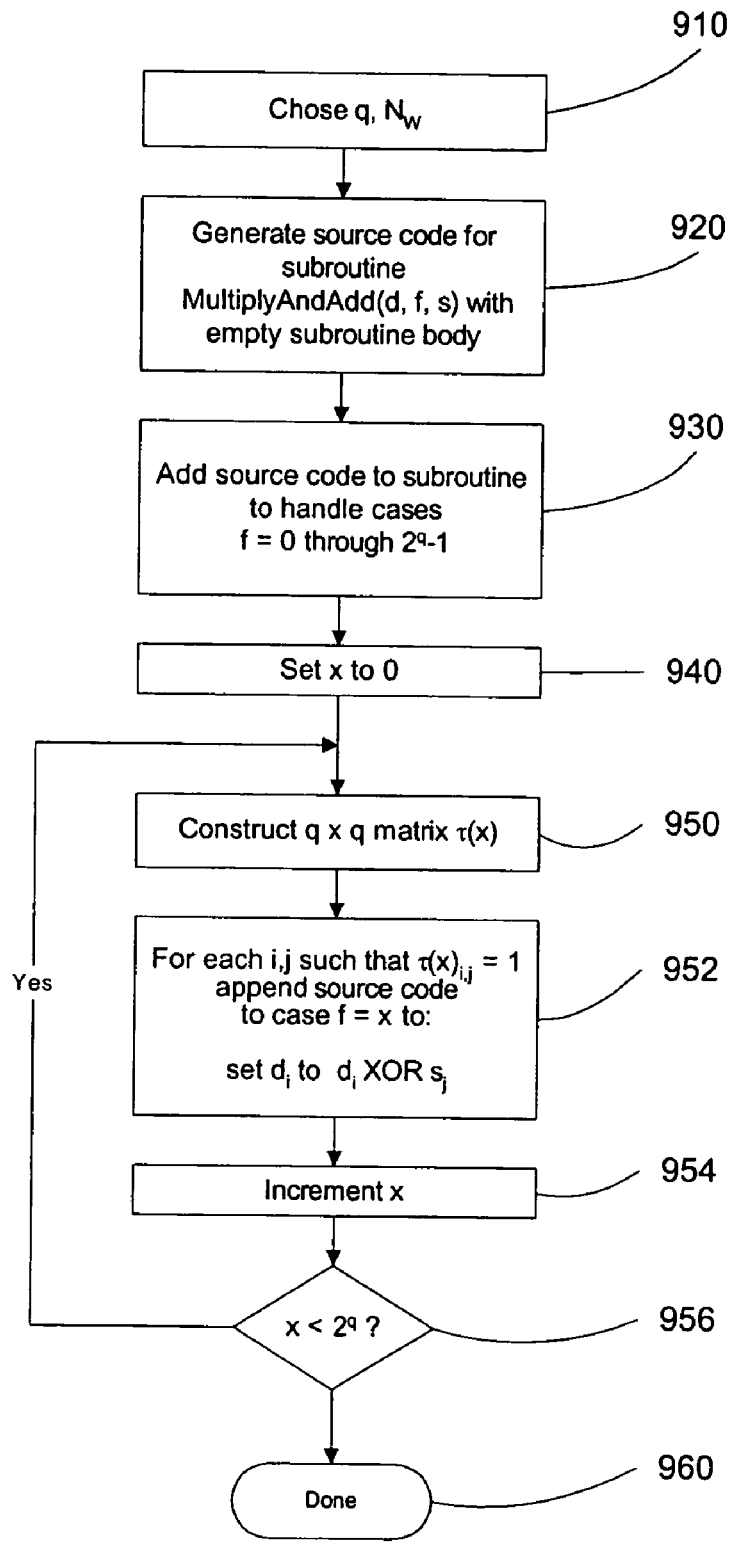
FIG. 9 is a flowchart for one method of generating source code for the MultiplyAndAdd(d, f, s) subroutine in accordance with one embodiment of the present invention.

FIG. 9 shows a flowchart of one process for generating the source code for the subroutine MultiplyAndAdd(d, f, s). The details depend on the language being used and would be understood by one skilled in the art. Values of q and $N_w$ are chosen and provided as input to the process (step 910).) In step 920, source code is generated for the subroutine with an empty subroutine body. If assembly language is being used, this will involve establishing the conventions used to pass arguments and saving and restoring registers that will be used to store temporary values. If a high level language such as C/C++ is being used, this will include defining the name and type of the arguments. In one embodiment of the invention, d and s will be passed by reference or as pointers while f will be passed by value. Initially, the subroutine body is empty. To this is added source code to implement the $2^q$ cases of the subroutine argument f (step 930.) If an assembler is being used, this will typically involve the creation of a table of addresses indexed by f through which to jump. If a high level language such as C/C++ is being used, this will consist of generating a "switch" statement with $2^q$ "case" statements, one for each value of f. A loop iterates the values of $GF(2^q)$ with the variable x, starting with zero (step 940.) For each x, the matrix τ(x) is constructed (step 950.) The values of the elements of matrix τ(x) are tested and used to control the generation of code (step 952.) For each i and j such that $\tau_{i,j}(x)$ equals 1, code is added to the case statement of f-x to perform $$d_i = d_i \oplus s_j$$

where $d_i$ is the i-th hyperword of the chunk passed as parameter d, $s_j$ is the j-th hyperword of the chunk passed as parameter s and $\oplus$ is bit-wise exclusive-or of hyperwords. At the bottom of the loop, x is incremented (step 954) and compared with $2^q$ to determine if all values have been iterated (step 956.) When the loop terminates, the process is complete (step 960.)

The invention makes use of a novel coding matrix that increases the encoding performance and decreases the decoding effort for the most common failure scenarios. FIG. 10 shows the matrix A as an augmented matrix composed of three sub-matrices: a m×m identity matrix $I_m$, a 1×m matrix of ones denoted P and a (k−1)×m matrix denoted C. The identity matrix $I_m$ makes the code systematic. The matrix P makes the code identical to parity for calculating the first ECC piece. When there is only loss of a single data piece, decode can be performed by parity as well.

The sub-matrix C is also chosen for performance. The elements of C, denoted by $c_{i,j}$, are chosen to satisfy the following criteria:

All sub-matrices of A formed by deleting k rows are non-singular; and

The total number of XORs required to perform the encoding is minimized.

The first criterion is merely a mathematical statement of the conditions that are necessary for an invertible linear erasure correcting code. The second criterion, which maximizes encoding performance, is a novel aspect of the current invention. W(x) is defined to be the number of XORs of hyperwords needed to multiply a chunk by x and add it to another chunk. The total number of XORs to apply the encoding matrix A is:

$$W_{Encode} = q \cdot m + \sum_{i=1}^{k-1} \sum_{j=1}^{m} W(c_{i,j})$$

Use has been made of the fact that it is not necessary to perform multiplication by the rows of the identity sub-matrix and that W(1) is q for each of the ones in sub-matrix P.

In one embodiment of the invention, exhaustive search is used to determine the values of $c_{i,j}$ such that $W_{Encode}$ is minimized. In such an embodiment, matrices of the form given in FIG. 10 are created for all possible choices of the values of $c_{i,j} \in GF(2^q)$, the matrix is tested for suitability by making sure it is invertible for all possible deletions of k rows and a suitable matrix with the minimum value of $W_{Encode}$ is chosen. Such an approach is computationally tractable for small values of $2^q$ and of the product (k−1)·m.

The values of $c_{i,j}$ may be constrained to be a form such that A satisfies the invertability criteria and $W_{Encode}$ is minimized relative to that form. One such form is to use a Cauchy matrix for C. Using this form, all sub-matrices of A formed by deleting k rows are non-singular if $m+k-1 \leq 2^q$. This implies that $q_{min}(A) = \log_2(m+k-1)$.

Using a Cauchy matrix for C allows considerable flexibility in choosing $c_{i,j}$ such that $W_{Encode}$ is minimized. The elements of the C are given by $$c_{i,j} = \frac{1}{x_i + y_j}$$

where $x_i + y_j \neq 0$ for all i,j $x_i \neq x_j$ and $y_i \neq y_j$ for $i \neq j$ This definition effectively divides the values of $GF(2^q)$ into two disjoint sets $S_x$ and $S_y$, the k−1 distinct values of $x_i \in S_x$ and the m distinct values of $y_j \in S_y$. The optimization problem is then to minimize $W_{Encode}$ for the possible choices of the sets $S_x$ and $S_y$. There are $$\frac{2^q!}{(k-1)!m!(2^q-m-k+1)!}$$

ways of assigning the $2^q$ elements of $GF(2^q)$ to the sets $S_x$ and $S_y$. In one approach, each combination of $S_x$ and $S_y$ is computed and used to calculate a candidate matrix. By sorting the candidate matrices by $W_{Encode}$, the optimal matrices can be determined. In general, there will be many matrices with the same minimal value of $W_{Encode}$ to choose from. The application of this procedure to create an optimal 8×5 encoding matrix for q=4 is illustrated in the following. There are 240240 choices of $S_x$ and $S_y$. For each choice, the $c_{i,j}$ values of a candidate matrix are calculated and $W_{Encode}$ is computed and stored along with $S_x$ and $S_y$ as an entry in a table. The entries in the table are then sorted in increasing order of $W_{Encode}$. Values of $W_{Encode}$ are found to range from 80 to 128. There are 16 choices of $S_x$ and $S_y$ that have the optimal value of $W_{Encode}=80$. These choices are shown in Table 2. One of the optimal encoding matrices is shown in FIG. 10B; it was constructed from $S_x=\{0,11\}$ and $S_y=\{1,2,4,9,10\}$.

TABLE 2

| $S_x$ | $S_y$ |
|---|---|
| 0, 11 | 1, 2, 4, 9, 10 |
| 0, 11 | 1, 2, 9, 10, 15 |
| 1, 10 | 0, 3, 5, 8, 11 |
| 1, 10 | 0, 3, 8, 11, 14 |
| 2, 9 | 0, 3, 6, 8, 11 |
| 2, 9 | 0, 3, 8, 11, 13 |
| 3, 8 | 1, 2, 7, 9, 10 |
| 3, 8 | 1, 2, 9, 10, 12 |
| 4, 15 | 0, 5, 6, 13, 14 |
| 4, 15 | 5, 6, 11, 13, 14 |

TABLE 2-continued

| $S_x$ | $S_y$ |
|---|---|
| 5, 14 | 1, 4, 7, 12, 15 |
| 5, 14 | 4, 7, 10, 12, 15 |
| 6, 13 | 2, 4, 7, 12, 15 |
| 6, 13 | 4, 7, 9, 12, 15 |
| 7, 12 | 3, 5, 6, 13, 14 |
| 7, 12 | 5, 6, 8, 13, 14 |

For the important case of k=2, there is a more direct approach for determining optimal values of $c_{i,j}$. Sort the non-zero values of $x \in GF(2^q)$ into ascending order of W(x) to produce the sequence $\eta_j$ for j=1 to $2^q-1$. The sequence then has the property that $W(\eta_i) < W(\eta_j)$ for i<j. The choice of $c_{1,j} = \eta_j$ results in a (m+2)×m matrix A that satisfies both criteria for $m \leq 2^q-1$. This particular choice of $c_{i,j}$ is not unique and other choices may be derived from it as follows. Any permutation of the j values assigned to $c_{1,j}$ produces an equally suitable choice of matrix with the same $W_{Encode}$. In cases where there exists values $\eta_s$ for s>m such that $W(\eta_s)=W(\eta_m)$, these values may be substituted for any value with $W(\eta_m)$ without affecting $W_{Encode}$.

The application of this procedure to create an optimal 7×5 encoding matrix for q=4 is illustrated in the following. The non-zero values of $x \in GF(2^4)$ are listed in Table 3 in ascending order of W(x). The first five values in the table result in the minimal value of $W_{Encode}$. The values are 1, 2, 9, 4 and 8. These values may be assigned to $c_{1,j}$ in any order. Since W(8) equals W(13), 13 may be substituted for 8 to create an equally suitable matrix of equal $W_{Encode}$. One of the optimal 7×5 encoding matrices so produced in shown in FIG. 10C.

TABLE 3

| $x \in GF(2^4)$ | W(x) |
|---|---|
| 1 | 4 |
| 2 | 5 |
| 9 | 5 |
| 4 | 6 |
| 8 | 7 |
| 13 | 7 |
| 6 | 9 |
| 12 | 9 |
| 3 | 9 |
| 5 | 10 |
| 11 | 10 |
| 15 | 10 |
| 14 | 12 |
| 10 | 12 |
| 7 | 13 |

To reduce the decode times, the invention pre-calculates and stores all the inverse matrices that may be required to recover up to k lost pieces. The invention treats lost data pieces and ECC pieces the same by way of a novel formulation of the decode process. For each subset F containing k of the m row indices, a repair matrix $R_F$ is computed as follows:

$$R_F = A \cdot [D_F(A)]^{-1}$$

where A is a systematic encoding matrix. To repair the lost rows, the process is $$R_F \cdot D_F(y_i) = y_i \text{ for all } i = [1, N/m]$$

Only the rows with indices in set F need to be stored and applied. In terms of the row deletion operator, the matrix stored is $D_{\bar{F}}(R_F)$ where $\bar{F}$ is the set of all valid row indices that are not in set F. Just as there is a vector PM to map the rows of $D_F(y_i)$ to rows of $y_i$, there is a vector SM to map the rows of $D_{\bar{F}}(R_F)$ to the rows of $R_F$.

If there are fewer than k lost pieces, then additional losses can be claimed to find a suitable $R_F$ and only the rows that are truly missing need to be applied. In an alternative embodiment of the invention, the matrices for k lost rows are not shared with the cases where there are fewer losses. Instead, repair matrices are generated and stored for all possible combinations of 1 loss, 2 losses, . . . , k-losses. The advantage of this approach is simpler control logic to find the rows of the matrix to apply, but at the cost of more memory to store the additional matrices.

The repair matrix combines two separate operations into one. If both a data piece and an ECC piece are lost, conventional decode processes would restore the data pieces (which are equivalent to the segments for a systematic code) and then to apply the encode matrix to compute the missing ECC pieces. In the present invention, both steps are combined in a single matrix without incurring additional computation effort.

Figure 11:
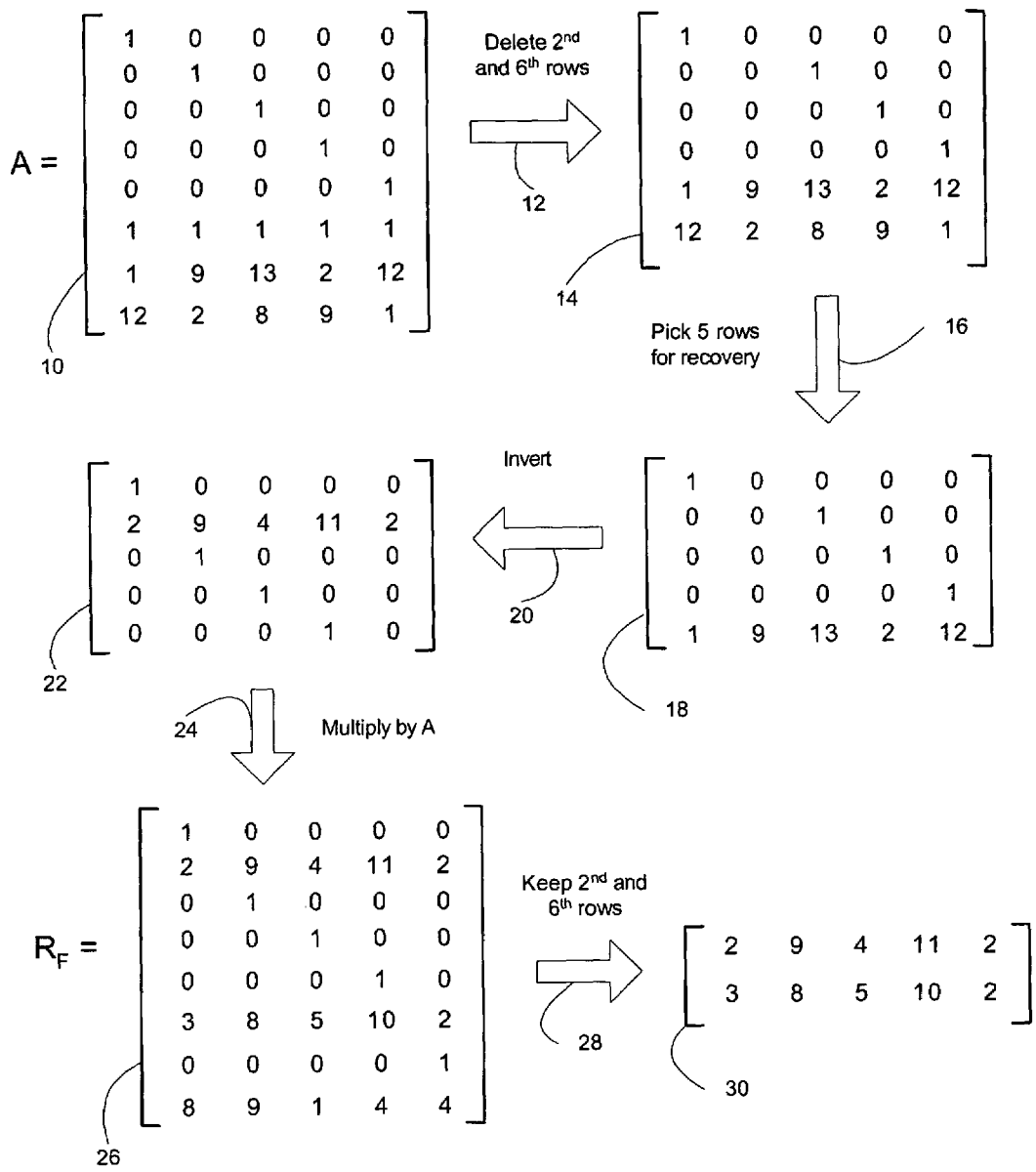
FIG. 11 is a diagram illustrating the construction of a repair matrix in one particular scenario of erasures in accordance with an embodiment of the present invention.

FIG. 11 illustrates steps in constructing a repair matrix for a particular recovery scenario in accordance with one embodiment of the present invention. In this scenario, m=5 and k=3, q=4 and the $2^{nd}$ and $6^{th}$ pieces are to be recovered. The encoding matrix 10 corresponds to m=5, k=3 and q=4 and has the property that every 5×5 sub-matrix created from it is invertible. Corresponding to the erasure of the $2^{nd}$ and $6^{th}$ pieces, the $2^{nd}$ and $6^{th}$ rows of the encoding matrix are deleted 12, resulting in a 6×5 matrix 14. Since the number of erasures is less than k, this matrix is not square. Any 5 rows of this matrix may be picked 16 to create a square matrix 18 to invert. The choice of rows may take into account differences in the effort to decode. As many of the rows that belong to the parity P and identify I sub-matrices of matrix A as possible may be picked. The square matrix is then inverted 20 to produce a decode matrix 22. The decode matrix is multiplied 24 by the encode matrix A to create the repair matrix $R_F$ 26 for repairing the erased pieces. All rows in the repair matrix are identity transformations except for the $2^{nd}$, $6^{th}$ and $8^{th}$ rows. The $8^{th}$ row is not an identity transformation because of the additional row (the $8^{th}$) that had effectively been deleted to make the matrix square. In this scenario, only the repair of the $2^{nd}$ and $6^{th}$ pieces is of interest so only these pre-calculated rows are kept 28 producing a 2×5 matrix 30 that is stored (with information regarding the identity of the kept rows) and looked up when the repair is needed.

The invention makes use of a hashing function for fast lookup of the stored repair matrices. Each of the indices identifying pieces needing repair is encoded as a bit in a bit mask—the need to repair piece i is encoded by setting the i-th bit of the bit mask to one. The bit mask consists of m-bits and there may be 0 to as many as k bits set in the bit mask. The number of non-zero bits in the bit mask is denoted by $\lambda$.

Figure 12:
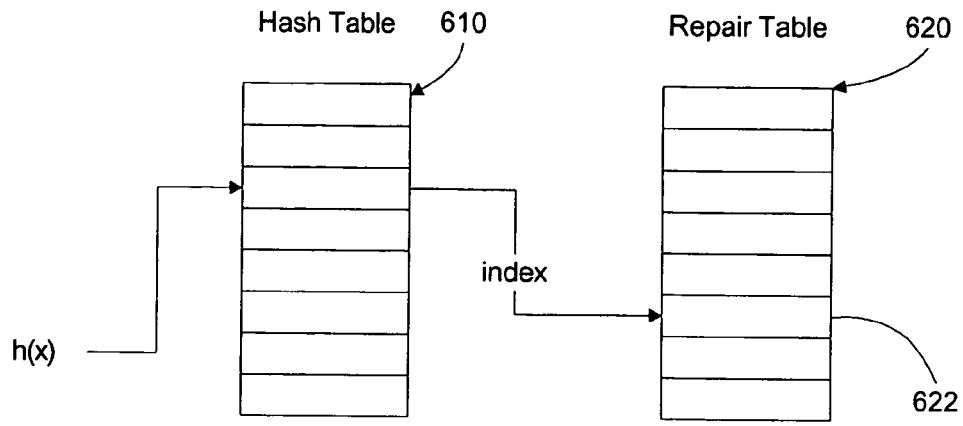
FIG. 12 is a diagram of an embodiment of data structures used to store and lookup repair matrices in accordance with the present invention.

FIG. 12 is a block diagram showing data structures used to store and lookup repair matrices. Given the value x of the bit mask, a hash function h(x) computes the index into a hash table 610. Each entry in the hash table is an index into a repair table 620. Each entry 622 in the repair table contains all the information needed to perform the repair indicated by the bit mask.

Table 4 provides an example of information stored in each entry of the repair table for one embodiment of the invention.

TABLE 4

| | |
|---|---|
| e | Number of rows of the stored repair matrix. |
| m | Number of columns of the stored repair matrix. |
| SM | An e × 1 vector mapping the row index of the stored repair matrix to a segment index. |
| PM | An m × 1 vector mapping the column index of the stored repair matrix to a piece index. |
| $D_F(R_F)$ | The e × m stored repair matrix. |

The hash table serves two purposes in the invention. First, it works with the hash function to provide a computational method of accessing matrices without the need to search memory. Second, it implements a policy regarding which of a multitude of repair matrices is to be used to repair cases where there are fewer than k failures.

The hash table and repair table may be small enough to fit in the processor's cache or fast memory. For bit masks with a maximum of k of n bits set, there are $$\sum_{e=1}^{k} \frac{n!}{e!(n-e)!}$$

non-zero bit mask values. At most, one repair table entry is needed for each of these bit masks. The size of the hash table, however, depends on the hash function.

The hash function is a compromise between fast execution and memory utilization. Fast execution is achieved by limiting operations to those that can be executed in the processor's registers. A reasonable tradeoff between hash function computation and hash table size is provided by the following hash function:

$$h(x) = \sum_{i=0}^{\lambda-1} n^i \cdot \beta_i$$

where the $\beta_i$ are the bit-positions $\in [1, n]$ of the $\lambda$ non-zero bits within the bit mask x, ordered such that $\beta_i > \beta_j$ for all i<j. In practice, the hash function can be implemented without prior knowledge of $\lambda$. This eliminates the need to count the bits set in a bit mask prior to computing the hash.

Figure 13:
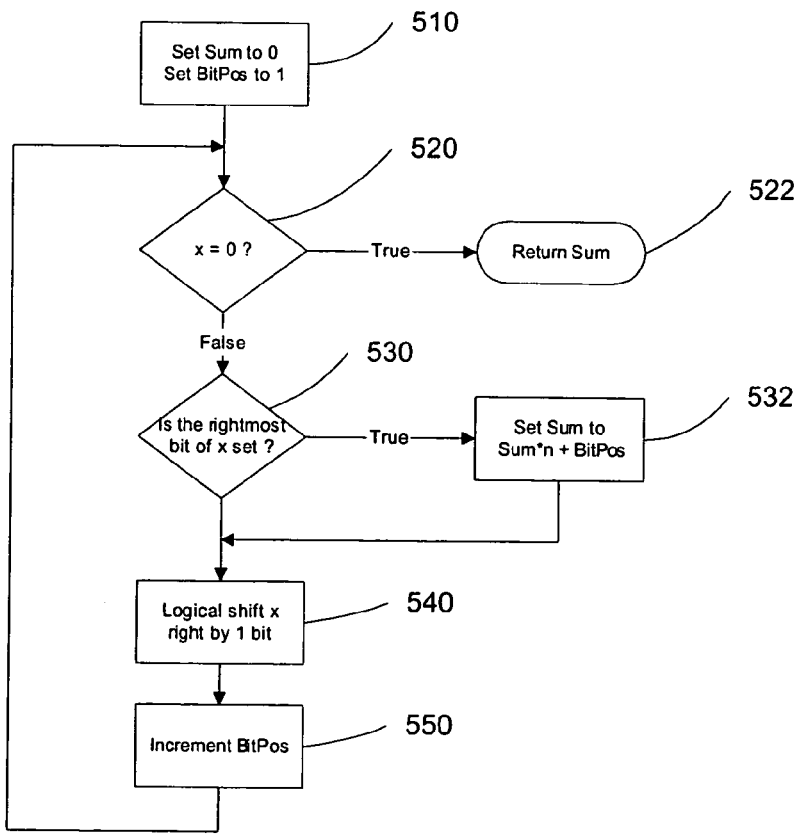
FIG. 13 is a flowchart of an implementation of the hash function h(x)

FIG. 13 is a flowchart of an implementation of the hash function h(x). In addition to the bit mask x, the subroutine makes use of two variables, Sum and BitPos, which can be registers. These variables are initialized to 0 and 1, respectively, in step 510. The hash function is implemented as a loop that terminates when the result of comparing the bit mask x with zero (step 520) is True. The value of the hash function returned is in the variable Sum (step 522.) While the bit mask is non-zero, its right most bit is tested in step 530. At the time that the right most bit is tested, the value in variable BitPos is the original bit position of the right most bit of x. If the right most bit is set, then the value of Sum is updated (step 532.) Each time through the loop, x is logically shifted right by one (step 540) and the BitPos is incremented (step 550.)

The number of entries in the hash table is one plus the maximum value of the hash function. The maximum value of the hash function occurs when $\lambda = k$, $A_o = n$, $A_1 = n-1$, ... and is given by $$\sum_{i=0}^{k-1} n^i \cdot (n-i)$$

This maximum value is used to determine the amount of memory to allocate for the hash table.

Figure 14A:
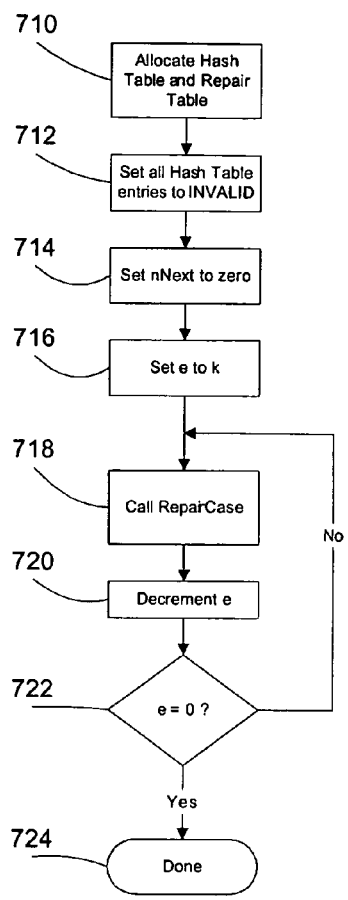
FIGS. 14A and 14B are flowcharts illustrating a method for initializing the data structures used to store and lookup repair matrices in accordance with the present invention.
Figure 14B:
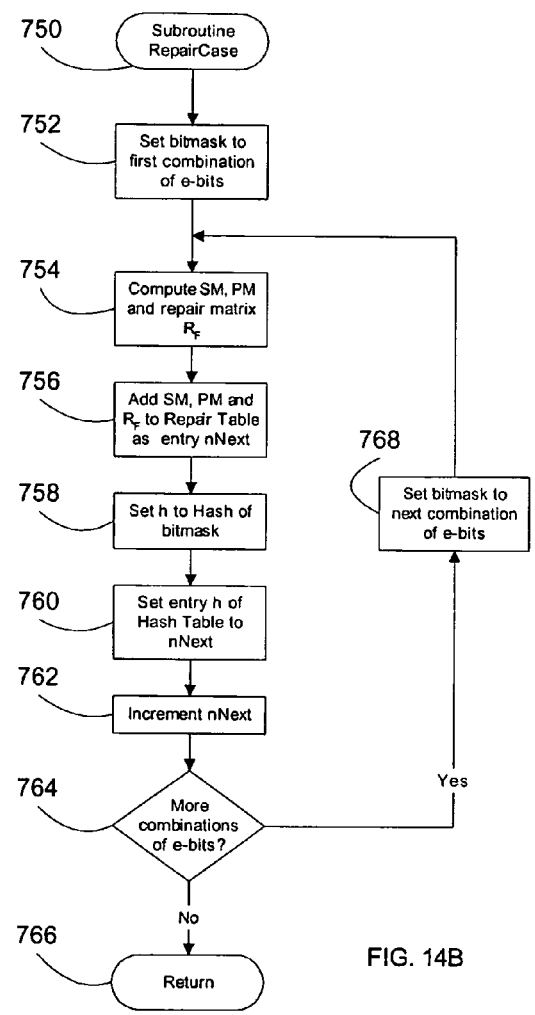

FIGS. 14A and 14B are flowcharts describing the initialization of the hash table and repair table in one embodiment of the invention. Referring to FIG. 14A, the hash table and repair tables are first allocated (in step 710.) The hash table entries are set to INVALID in step 712. INVALID is defined to be −1 or some other illegal repair table index that can be used to catch a bad hash as a consequence of logic errors. The variable nNext, which is the index of the next available entry in the repair table, is initialized to zero (step 714.) The variable e, which is the number of erasures, is set to k in step 716. A loop then calls (in step 718) subroutine RepairCase and decrements e (step 720) until e is zero (step 722.) The initialization of the Hash Table and Repair Table completes (step 724) when the loop terminates.

Most of the work for initialization is performed by subroutine RepairCase. Referring to FIG. 14B, subroutine RepairCase (step 750) is responsible for initializing all repair and hash table entries for repairing e erasures. The subroutine consists of a loop that iterates over all combination of e-bits set in a bitmask of n bit positions. There are a variety of methods that can be used to generate a sequence that iterates over a combination and these would be known to someone skilled in the art. Prior to the loop, the bitmask is initialized to the first such combination in the sequence (step 752.) Each iteration through the loop initializes an entry of the Repair Table and the Hash Table to corresponds to bitmask. First the vector SM, vector PM and repair matrix RF that correspond to bitmask are computed (step 754.) These are then added as entry nNext of the Repair Table (step 756.) The hash function is computed for the value of bitmask and assigned to variable h (step 758.) Entry h in the Hash Table is set to nNext (step 760.) Finally, nNext is incremented in step 762. At the bottom of the loop, the availability of more combinations to process is determined (step 764.) If there are no more combinations to process, the loop terminates and the subroutine returns (in step 766.) If there are more combinations to process, the bitmask is set to the next combination in the sequence (step 768) and the loop is repeated.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A computerized method for encoding digital information for protection from data loss in storage or memory or in transmission on communication paths using a linear transformation defined by an (m+k)×m coding matrix A over a Galois Field $GF(2^q)$, said encoding method comprising the steps of:

assembling an m×1 vector x comprised of components $x_j$ from m data chunks representing the digital information, each chunk comprising q hyperwords each of an identical but arbitrary number of bits; and multiplying said vector x by said matrix A, comprised of elements $A_{ij}$, using the operations provided by a MultiplyAndAdd($y_i$, $A_{ij}$, $x_j$) subroutine to produce an (m+k)×1 vector y of m+k chunks $y_i$ that are resilient to the erasure of any k chunks, said operations including jumping to or otherwise executing a predetermined sequence of instructions that are unique to the binary value of $A_{ij}$, each of said predetermined sequence of instructions consisting of a bitwise XOR of a hyperword of chunk $x_j$ with and stored in a hyperword of chunk $y_i$.

2. The method of claim 1, wherein the number of bits occupied by the q hyperwords is an integer multiple of the cache line size of a processor implementing said method.

3. The method of claim 1, further comprising the step of generating subroutine MultiplyAndAdd(d, f, s) by performing the steps of:

generating source code for an empty subroutine body;

adding source code to the subroutine body to dispatch to a sequence of instructions that is unique to each of the values of f=0 through $2^q-1$;

adding said sequence of instructions to the subroutine body for each of the values of f=0 through $2^q-1$, by repeating for each specific value of f=x in a Galois Field $GF(2^q)$ the steps of:

constructing a q×q matrix τ representing the operation of multiplication by x in the Galois Field GF(2);

testing the value of each element $\tau_{ij}$ of said matrix τ; and appending instructions to store the XOR of the i-th hyperword of chunk d with the j-th hyperword of chunk s into the i-th hyperword of chunk d for each nonzero value of said element $\tau_{ij}$.

4. A computerized method for constructing a (m+k)×m coding matrix A for use in linear erasure codes which is optimized for single erasure recovery, comprising the steps of:

constructing from elements of a Galois Field $GF(2^q)$ an augmented coding matrix comprised of:

an m×m identity sub-matrix I;

a 1×m row sub-matrix P, the elements of said row matrix P having the value 1 in the Galois Field; and a (k−1)×m sub-matrix C, the elements $c_{ij}$ of said matrix C chosen so that all sub-matrices of A formed by deleting k rows are non-singular; and encoding information data using the augmented coding matrix and transmitting on a communications channel.

5. The method of claim 4, further comprising the step of choosing the elements $c_{ij}$ so as to minimize the sum over all i,j of a function $W(c_{ij})$, said function $W(c_{ij})$ defined as the count of the non-zero elements in the q×q matrix τ representing the operation of multiplication by $c_{ij}$ in the Galois Field GF(2).

6. The method of claim 5, wherein said step of choosing the elements $c_{ij}$ so as to minimize said sum over all i,j of the function $W(c_{ij})$ further comprises the steps of:

enumerating all partitionings of $2^q$ values in $GF(2^q)$ into a set $S_x$ comprised of k−1 values and a set $S_y$ comprised of m values to obtain an enumeration of partitionings;

computing a sum over all ij of the function $W(c_{ij})$ where $c_{ij}=1/(x_i+y_j)$ for $x_i \in S_x$ and $y_j \in S_y$; and choosing from the enumeration of partitionings an optimal partitioning for which said sum over all i,j of the function $W(c_{ij})$ is minimal;

constructing the values $c_{ij}$ from said optimal partitioning.

7. The method of claim 6, wherein:

k=2; and said step of enumerating all partitionings of the $2^q$ values in $GF(2^q)$ is limited to enumerations that satisfy $S_x=\{0\}$.

8. A computerized method for recovering stored or transmitted digital information form storage or memory or from a transmitter on a communication path that has been encoded with a linear erasure correcting code defined by a (m+k)×m coding matrix A over a Galois Field $GF(2^q)$, said encoded digital information represented by m+k data chunks, each of which is associated with a row index, said method for recovering from 1 to k chunks comprising the steps of:

constructing a set F containing the row indices associated with the data chunks to be recovered and additional row indices so as to increase the number of elements in the set F to k;

constructing an (m+k)×1 vector x from said chunks such that the i-th component of vector x is the data chunk associated with row index i;

constructing a row deleted m×1 vector from said vector x by deleting each row of the vector x with a row index in set F;

calculating an (m+k)×m repair matrix $R_F$ from matrix A, said calculation of the matrix $R_F$ further comprising the steps of constructing an m×m matrix by deleting each row of the matrix A with a row index in set F, calculating the inverse of said row deleted m×m matrix, and multiplying the matrix A by said inverse of the row deleted m×m matrix to produce the (m+k)×m repair matrix $R_F$; and using the (m+k)×m repair matrix $R_F$ as a coding matrix in a linear transformation of the m data chunks of said row deleted m×1 vector to produce an (m+k)×m vector, where row i is the recovered data chunk associated with row index i.

9. The method of claim 8, further comprising the steps of:

storing pre-calculated rows of the repair matrix $R_F$ in a repair table indexed by a hash table for fast lookup; and looking up rows of the repair matrix for recovering the chunks identified by a set F of row indices through the steps of creating a bit mask by setting to 1 only those bits at bit positions that equal the row indices in set F, computing the value of a hash function h(x), where x is the bit mask, indexing into said hash table using said value and retrieving a repair table index, and indexing into said repair table using said repair table index and retrieving said rows of the repair matrix for recovering the chunks with row indices in set F.

10. The method of claim 9, wherein the step of storing pre-calculated rows of the repair matrices into said repair table indexed by said hash table further comprises the steps of:

allocating space for a hash table and a repair table and initializing the contents of said hash table and repair table to indicate an initial empty state; and iteratively adding content to the repair table and the hash table to facilitate the recovery of any e chunks, where e in each iteration takes the values k, k−1, . . . , 0.

11. The method of claim 10, wherein said step of iterative adding further comprises the steps of enumerating all valid bitmask values with e bits set and for each enumerated bitmask value, performing the steps comprising:

computing or otherwise obtaining a repair matrix $R_F$ suitable for recovering the chunks that are described by the bitmask value;

adding rows of said repair matrix to the repair table at the next available location;

computing the value of the hash function h(x) from the bitmask value; and storing the location of said rows of said repair matrix in the hash table at the hash table index equal to said value of the hash function.

12. The method of claim 11, wherein the number of chunks n=m+k and the hash function h(x) is calculated from the steps comprising:

initializing a variable Sum to zero and a variable BitPos to one;

returning the value of Sum as the value of the hash function if the value of x is zero or after repetitive operations on x have diminished its value to zero, said repetitive operations comprising:

setting the value of Sum to Sum×n+BitPos if the rightmost bit position of x is set, logically shifting x right by 1 bit position, and incrementing BitPos.

13. A computerized system for encoding digital information for protection from data loss in storage or memory or in transmission on communication paths using a linear transformation defined by an (m+k)×m coding matrix A over a Galois Field $GF(2^q)$, comprising:

a processor programmed to accomplish the steps of:

assembling an m×1 vector x comprised of components $x_j$ from m data chunks representing the digital information, each chunk comprising q hyperwords each of an identical but arbitrary number of bits;

multiplying said vector x by said matrix A, comprised of elements $A_{ij}$, using the operations provided by a MultiplyAndAdd($y_i$, $A_{ij}$, $x_j$) subroutine to produce an (m+k)×1 vector y of m+k chunks $y_i$ that are resilient to the erasure of any k chunks, said operations including jumping to or otherwise executing a predetermined sequence of instructions that are unique to the binary value of $A_{ij}$ each of said predetermined sequence of instructions consisting of a bitwise XOR of a hyperword of chunk $x_j$ with and stored in a hyperword of chunk $y_i$.

14. The system of claim 13, wherein the number of bits occupied by the q hyperwords is an integer multiple of the cache line size of the processor.

15. The system of claim 13, wherein the steps accomplished by the processor further comprise generating subroutine MultiplyAndAdd(d, f, s) by performing the steps of:

generating source code for an empty subroutine body;

adding source code to the subroutine body to dispatch to a sequence of instructions that is unique to each of the values of f=0 through $2^q-1$;

adding said sequence of instructions to the subroutine body for each of the values of f=0 through $2^q-1$, by repeating for each specific value of f=x in a Galois Field $GF(2^q)$ the steps of:

constructing a q×q matrix τ representing the operation of multiplication by x in the Galois Field GF(2);

testing the value of each element $τ_{ij}$ of said matrix τ; and appending instructions to store the XOR of the i-th hyperword of chunk d with the j-th hyperword of chunk s into the i-th hyperword of chunk d for each nonzero value of said element $τ_{ij}$.

16. A computerized system for constructing a (m+k)×m coding matrix A for use in linear erasure codes which is optimized for single erasure recovery, comprising:

a processor programmed to construct from elements of a Galois Field $GF(2^q)$ an augmented coding matrix comprised of:

an m×m identity sub-matrix I;

a 1×m row sub-matrix P, the elements of said row matrix P having the value 1 in the Galois Field; and a (k−1)×m sub-matrix C, the elements $c_{ij}$ of said matrix C chosen so that all sub-matrices of A formed by deleting k rows are non-singular.

17. The system of claim 16, wherein the processor is further programmed to accomplish the step of choosing the elements $c_{ij}$ so as to minimize the sum over all i,j of a function $W(c_{ij})$, said function $W(c_{ij})$ defined as the count of the non-zero elements in the q×q matrix τ representing the operation of multiplication by $c_{ij}$ in the Galois Field GF(2).

18. The system of claim 17, wherein said step of choosing the elements $c_{ij}$ so as to minimize said sum over all i,j of the function $W(c_{ij})$ further comprises the steps of:

enumerating all partitionings of $2^q$ values in $GF(2^q)$ into a set $S_x$ comprised of k−1 values and a set $S_y$ comprised of m values to obtain an enumeration of partitionings;

computing a sum over all i,j of the function $W(c_{ij})$ where $c_{ij}=1/(x_i+y_j)$ for $x_i \in S_x$ and $y_j \in S_y$;

choosing from the enumeration of partitionings an optimal partitioning for which said sum over all i,j of the function $W(c_{ij})$ is minimal; and constructing the values $c_{ij}$ from said optimal partitioning.

19. The system of claim 18, wherein:

k=2; and said step accomplished by the processor of enumerating all partitionings of the $2^q$ values in $GF(2^q)$ is limited to enumerations that satisfy $S_x=\{0\}$.

20. A computerized system for recovering stored or transmitted digital information that has been encoded with a linear erasure correcting code defined by a (m+k)×m coding matrix A over a Galois Field $GF(2^q)$, said encoded digital information represented by m+k data chunks, each of which is associated with a row index, comprising:

a processor programmed to recover from 1 to k chunks by accomplishing the steps of:

constructing a set F containing the row indices associated with the data chunks to be recovered and additional row indices so as to increase the number of elements in the set F to k;

constructing an (m+k)×1 vector x from said chunks such that the i-th component of vector x is the data chunk associated with row index i;

constructing a row deleted m×1 vector from said vector x by deleting each row of the vector x with a row index in set F;

calculating an (m+k)×m repair matrix $R_F$ from matrix A, said calculation of the matrix $R_F$ further comprising the steps of constructing an m×m matrix by deleting each row of the matrix A with a row index in set F, calculating the inverse of said row deleted m×m matrix, and multiplying the matrix A by said inverse of the row deleted m×m matrix to produce the (m+k)×m repair matrix $R_F$; and using the (m+k)×m repair matrix $R_F$ as a coding matrix in a linear transformation of the m data chunks of said row deleted m×1 vector to produce an (m+k)×m vector, where row i is the recovered data chunk associated with row index i.

21. The system of claim 20, wherein the processor is further programmed to accomplish the steps of:

storing pre-calculated rows of the repair matrix $R_F$ in a repair table indexed by a hash table for fast lookup; and looking up rows of the repair matrix for recovering the chunks identified by a set F of row indices through the steps of creating a bit mask by setting to 1 only those bits at bit positions that equal the row indices in set F, computing the value of a hash function h(x), where x is the bit mask, indexing into said hash table using said value and retrieving a repair table index, and indexing into said repair table using said repair table index and retrieving said rows of the repair matrix for recovering the chunks with row indices in set F.

22. The system of claim 21, wherein the step accomplished by the processor of storing precalculated rows of the repair matrices into said repair table indexed by said hash table further comprises the steps of:

allocating space for a hash table and a repair table and initializing the contents of said hash table and repair table to indicate an initial empty state; and iteratively adding content to the repair table and the hash table to facilitate the recovery of any e chunks, where e in each iteration takes the values k, k−1, . . . , 0.

23. The system of claim 22, wherein said step accomplished by the processor of iterative adding further comprises the steps of enumerating all valid bitmask values with e bits set and for each enumerated bitmask value, performing the steps comprising:

computing or otherwise obtaining a repair matrix $R_F$ suitable for recovering the chunks that are described by the bitmask value;

adding rows of said repair matrix to the repair table at the next available location;

computing the value of the hash function h(x) from the bitmask value; and storing the location of said rows of said repair matrix in the hash table at the hash table index equal to said value of the hash function.

24. The system of claim 23, wherein the number of chunks n—m+k and the hash function h(x) is calculated by the processor by accomplishing the steps comprising:

initializing a variable Sum to zero and a variable BitPos to one;

returning the value of Sum as the value of the hash function if the value of x is zero or after repetitive operations on x have diminished its value to zero, said repetitive operations comprising:

setting the value of Sum to Sum×n+BitPos if the rightmost bit position of x is set, logically shifting x right by 1 bit position, and incrementing BitPos.

25. A computer storage medium having computer-executable instructions for performing a method for encoding digital information for protection from data loss in storage or memory or in transmission on communication paths using a linear transformation defined by an (m+k)×m coding matrix A over a Galois Field $GF(2^q)$, said encoding method comprising the steps of:

assembling an m×1 vector x comprised of components $x_i$ from m data chunks representing the digital information, each chunk comprising q hyperwords each of an identical but arbitrary number of bits;

multiplying said vector x by said matrix A, comprised of elements $A_{ij}$, using the operations provided by a MultiplyAndAdd($y_i$, $A_{ij}$, $x_j$) subroutine to produce an (m+k)×1 vector y of m+k chunks $y_i$ that are resilient to the erasure of any k chunks, said operations including jumping to or otherwise executing a predetermined sequence of instructions that are unique to the binary value of $A_{ij}$, each of said predetermined sequence of instructions consisting of a bitwise XOR of a hyperword of chunk $x_j$ with and stored in a hyperword of chunk $y_i$.

26. The computer storage medium of claim 25, wherein the number of bits occupied by the q hyperwords is an integer multiple of the cache line size of a processor implementing said method.

27. The computer storage medium of claim 25, further comprising the step of generating subroutine MultiplyAndAdd(d, f, s) by performing the steps of:

generating source code for an empty subroutine body;

adding source code to the subroutine body to dispatch to a sequence of instructions that is unique to each of the values of f=0 through $2^q-1$;

adding said sequence of instructions to the subroutine body for each of the values of f=0 through $2^q-1$, by repeating for each specific value of f=x in a Galois Field $GF(2^q)$ the steps of:

constructing a q×q matrix τ representing the operation of multiplication by x in the Galois Field GF(2);

testing the value of each element $τ_{ij}$ of said matrix τ; and appending instructions to store the XOR of the i-th hyperword of chunk d with the j-th hyperword of chunk s into the i-th hyperword of chunk d for each nonzero value of said element $τ_{ij}$.

28. A computer storage medium having computer-executable instructions for performing a method for constructing a (m+k)×n coding matrix A for use in linear erasure codes which is optimized for single erasure recovery, comprising the steps of:

constructing from elements of a Galois Field $GF(2^q)$ an augmented coding matrix comprised of an m×m identity sub-matrix I;

a 1×m row sub-matrix P, the elements of said row matrix P having the value I in the Galois Field; and a (k−1)×m sub-matrix C, the elements $c_{ij}$ of said matrix C chosen so that all sub-matrices of A formed by deleting k rows are non-singular.

29. The computer storage medium of claim 28, further comprising the step of choosing the elements $c_{ij}$ so as to minimize the sum over all ij of a function $W(c_{ij})$, said function $W(c_{ij})$ defined as the count of the non-zero elements in the q×q matrix τ representing the operation of multiplication by $c_{ij}$ in the Galois Field GF(2).

30. The computer storage medium of claim 29, wherein said step of choosing the elements $c_{ij}$ so as to minimize said sum over all i,j of the function $W(c_{ij})$ further comprises the steps of:

enumerating all partitionings of $2^q$ values in $GF(2^q)$ into a set $S_x$ comprised of k−1 values and a set $S_y$ comprised of m values to obtain an enumeration of partitionings;

computing a sum over all i,j of the function $W(c_{ij})$ where $c_{ij}=1/(x_i+y_j)$ for $x_i \in S_x$ and $y_j \in S_y$; and choosing from the enumeration of partitionings an optimal partitioning for which said sum over all i,j of the function $W(c_{ij})$ is minimal;

constructing the values $c_{ij}$ from said optimal partitioning.

31. The computer storage medium of claim 30, wherein: k=2; and said step of enumerating all partitionings of the $2^q$ values in $GF(2^q)$ is limited to enumerations that satisfy $S_x=\{\ \}$.

32. The computer storage medium having computer-executable instructions for performing a method for recovering stored or transmitted digital information that has been encoded with a linear erasure correcting code defined by a (m+k)×m coding matrix A over a Galois Field $GF(2^q)$, said encoded digital information represented by m+k data chunks, each of which is associated with a row index, said method for recovering from 1 to k chunks comprising the steps of:

constructing a set F containing the row indices associated with the data chunks to be recovered and additional row indices so as to increase the number of elements in the set F to k;

constructing an (m+k)×1 vector x from said chunks such that the i-th component of vector x is the data chunk associated with row index i;

constructing a row deleted m×1 vector from said vector x by deleting each row of the vector x with a row index in set F;

calculating an (m+k)×m repair matrix $R_F$ from matrix A, said calculation of the matrix $R_F$ further comprising the steps of constructing an m×m matrix by deleting each row of the matrix A with a row index in set F, calculating the inverse of said row deleted m×m matrix, and multiplying the matrix A by said inverse of the row deleted m×m matrix to produce the (m+k)×m repair matrix $R_F$; and using the (m+k)×m repair matrix $R_F$ as a coding matrix in a linear transformation of the m data chunks of said row deleted m×1 vector to produce an (m+k)×m vector, where row i is the recovered data chunk associated with row index i.

33. The computer storage medium of claim 32, further comprising the steps of:

storing pre-calculated rows of the repair matrix $R_F$ in a repair table indexed by a hash table for fast lookup; and looking up rows of the repair matrix for recovering the chunks identified by a set F of row indices through the steps of creating a bit mask by setting to 1 only those bits at bit positions that equal the row indices in set F, computing the value of a hash function h(x), where x is the bit mask, indexing into said hash table using said value and retrieving a repair table index, and indexing into said repair table using said repair table index and retrieving said rows of the repair matrix for recovering the chunks with row indices in set F.

34. The computer storage medium of claim 33, wherein the step of storing pre-calculated rows of the repair matrices into said repair table indexed by said hash table further comprises the steps of:

allocating space for a hash table and a repair table and initializing the contents of said hash table and repair table to indicate an initial empty state; and iteratively adding content to the repair table and the hash table to facilitate the recovery of any e chunks, where e in each iteration takes the values k, k−1, . . . , 0.

35. The computer storage medium of claim 34, wherein said step of iterative adding step further comprises the steps of enumerating all valid bitmask values with e bits set and for each enumerated bitmask value, performing the steps comprising:

computing or otherwise obtaining a repair matrix $R_F$ suitable for recovering the chunks that are described by the bitmask value;

adding rows of said repair matrix to the repair table at the next available location;

computing the value of the hash function h(x) from the bitmask value; and storing the location of said rows of said repair matrix in the hash table at the hash table index equal to said value of the hash function.

36. The computer storage medium of claim 35, wherein the number of chunks n=m+k and the hash function h(x) is calculated from the steps comprising:

initializing a variable Sum to zero and a variable BitPos to one;

returning the value of Sum as the value of the hash function if the value of x is zero or after repetitive operations on x have diminished its value to zero, said repetitive operations comprising:

setting the value of Sum to Sum×n+BitPos if the rightmost bit position of x is set, logically shifting x right by 1 bit position, and incrementing BitPos.

\* \* \* \* \*